(12) United States Patent
Lee

(10) Patent No.: US 8,014,154 B2
(45) Date of Patent: Sep. 6, 2011

(54) CIRCUIT SUBSTRATE FOR PREVENTING WARPAGE AND PACKAGE USING THE SAME

(75) Inventor: Dae-Ho Lee, Chungchungnam-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 1041 days.

(21) Appl. No.: 11/766,523

(22) Filed: Jun. 21, 2007

(65) Prior Publication Data

US 2008/0073784 A1 Mar. 27, 2008

(30) Foreign Application Priority Data

Sep. 27, 2006 (KR) .................. 10-2006-0094330

(51) Int. Cl.
*H05K 1/00* (2006.01)

(52) U.S. Cl. .................. 361/749; 361/770; 361/774
(58) Field of Classification Search .......... 361/770–774; 257/666–670, 723–730
See application file for complete search history.

(56) References Cited

U.S. PATENT DOCUMENTS

| 5,710,064 A | * | 1/1998 | Song et al. ............. 438/123 |
| 6,339,252 B1 | * | 1/2002 | Niones et al. ............. 257/666 |
| 6,423,643 B1 | * | 7/2002 | Furuhata et al. ............. 438/694 |
| 6,864,434 B2 | | 3/2005 | Chang et al. |

FOREIGN PATENT DOCUMENTS

| JP | 2000-151035 | 5/2000 |
| JP | 2002-280676 | 9/2002 |
| KR | 2006-0064315 | 6/2006 |

* cited by examiner

*Primary Examiner* — Tuan T Dinh
(74) *Attorney, Agent, or Firm* — Muir Patent Consulting, PLLC

(57) ABSTRACT

In one embodiment, a circuit substrate comprises a substrate; and a warpage preventing pattern disposed on the substrate. The warpage preventing pattern comprises a first pattern at a first corner of the substrate and a second pattern at a second corner of the substrate. The first corner and the second corner are disposed adjacent to each other. An overall orientation of the first pattern is different from an overall orientation of the second pattern with respect to the substrate. The warping of a semiconductor package can be significantly reduced by cutting off stress lines in the corners of the circuit substrate. Various configurations and orientations of the warpage preventing pattern are provided in order to effectively block stress concentration in the corners of the circuit substrate.

35 Claims, 19 Drawing Sheets

CIRCUIT SUBSTRATE FOR PREVENTING WARPAGE AND PACKAGE USING THE SAME

CROSS-REFERENCE TO RELATED APPLICATIONS

This application claims priority under 35 USC §119 to Korean Patent Application No. 2006-0094330 filed on Sep. 27, 2006, the contents of which are herein incorporated by reference in their entirety.

BACKGROUND

1. Field of the Invention

This disclosure relates to circuit substrates and packages including such circuit substrates. More particularly, the disclosure relates to circuit substrates having improved warpage preventing properties and methods of manufacturing warpage preventing circuit substrates and packages having the warpage preventing circuit substrates.

2. Description of the Related Art

Modern electronic devices require small size, large memory capacity and high performance for their applications such as mobile applications. Consequently, semiconductor chip packages that go into modern electronic devices, such as mobile electronic devices, also have to have small size, large memory capacity, and high performance. Typically, semiconductor chip packages are either a lead frame type or a Ball Grid Array (BGA)/Land Grid Array (LGA) type. A printed circuit board (PCB) or film substrate is often used in conjunction with a BGA/LGA type package to obtain high reliability and reduced size and weight of the semiconductor chip package.

A PCB includes an insulating substrate, which is typically made of a polyimide material, and a conductive pattern, which is typically made of copper (Cu). The conductive pattern can be disposed in between layers of the substrate or it may be disposed on one of the substrate surfaces. When a chip package is used in an electronic system, such as the main board in a mobile electronic device, the package may be subjected to a heat step for bonding purposes. As a result of the heat step, package warping may occur due to the coefficient of thermal expansion (CTE) mismatch between the various components in the chip package. These components include the semiconductor chip, the substrate, and the molding compound.

FIG. 1 shows a conventional semiconductor chip package design. A semiconductor chip 20 is disposed on a circuit substrate 10. The chip 20 is coupled to a conductive pattern 22 through a wire 16. One end of the wire is connected to a chip pad 18 and the other end of the wire is connected to a bond finger 14. A dummy pattern 12 is disposed on the substrate 10 to increase the strength of the substrate 10 as disclosed in U.S. Pat. No. 6,864,434. The dummy pattern 12 can be connected to a power or a ground lead of the semiconductor chip package. The conductive pattern 22 may include solder ball pads, upon which solder balls can be formed. The solder balls may be formed by applying a solder paste to the solder ball pads and using a heat step to form the solder balls from the solder paste.

FIG. 2 is a cross-sectional view of a semiconductor chip package mounted on a circuit board 40, showing warpage at the edges of the chip package. A conventional process for manufacturing an electronic device having a semiconductor chip includes attaching a semiconductor chip 20 to a circuit substrate 10. The semiconductor chip is then connected electrically to the circuit substrate 10 by a wire 16. This step may be accomplished by a standard wire-bonding process, as is known in the art. Next, the semiconductor chip 20 and the wire 16 are encapsulated by an epoxy molding compound (EMC) 50. Solder balls or solder bumps 30 are then attached to the circuit substrate 10. Next, a singulation step is performed to separate individual semiconductor chip packages from each other. This step may be accomplished by a wafer dicing process. Finally, the solder balls or solder bumps 30 are used to attach the chip package to a circuit board 40. This step may include a heat treatment to melt the solder balls or to melt other conductive material, such as solder paste, for attaching the chip package to the circuit board.

One problem with the conventional semiconductor chip package design is that heat steps used to either form solder balls or join the chip package to the circuit board can cause warpage of the chip package, as shown at "a" in FIG. 2. This warpage can be due to the CTE mismatch between the semiconductor chip 20, the circuit substrate 10, and the EMC 50. This warpage can lead to open connection failures between the chip package and the circuit board as illustrated in a center area of the circuit board of FIG. 2. Further, the stress resulting from the difference in CTE of the materials in the thickness direction of the substrate (i.e. the substrate material, the conductive pattern, and the dummy pattern) can also play a major role in causing warpage of the chip package.

FIGS. 3a and b are stress contour graphs of the circuit substrate 10 during a heat treatment process to mount the chip package to the circuit board. The darker areas of FIGS. 3a and b indicate areas of higher stress. As shown in the figures, the corners and the center areas of the circuit substrate have relatively higher stress concentration than the other areas of the circuit substrate 10. However, as the semiconductor chip 20 is in the center area of the circuit substrate 10 and can therefore resist the stress concentration in the center area, the stress in the center area of the circuit substrate 10 is relatively small. There is, however, not enough resistance to offset the stress at the corners of the circuit substrate 10. Therefore, the stress at the corners of the circuit substrate 10 leads to warpage. Further, the conductive pattern and the dummy pattern, being made of copper, have a high CTE, or high shrinkage rate, thereby causing additional concentration of stress at the corners.

In other words, stress is concentrated at the four corners of the circuit substrate 10 as indicated at "b". As the thermal expansion or shrinkage rate of the chip 20 is relatively low, the chip 20 opposes the stress generated between the circuit substrate 10 and EMC 50. Therefore, warpage of the area of the circuit substrate 10 where the chip 20 is attached is relatively small. In contrast, in the region "b", there is not enough stress resistant material such as the chip 20 to oppose the stress. Thus, the stress is applied without much resistance. In particular, the conductive patterns, which have a higher shrinkage rate, cause thermal stress directed toward the corners of the circuit substrate 10. Moreover, the dummy pattern 12 increases the shrinkage of the circuit substrate 10 even higher, thereby increasing the warpage in the region "b". Such warpage causes non-uniform height of the solder balls 30 against the board 40 during mounting, thereby causing contact failures as illustrated in FIG. 2 as discussed above.

One method to prevent warpage of a chip package is disclosed in JP 2000-151035 ('035). '035 teaches a warpage preventive pattern disposed on a PCB. Another approach to prevent warpage is disclosed in U.S. Pat. No. 6,864,434, as mentioned above.

These conventional methods do not account for the different directions of stress lines that may be concentrated at the different corners of the substrate. Consequently, the stress may not be as effectively reduced at the corners of the substrate. The invention addresses these and other disadvantages of the conventional art.

SUMMARY

An object of this disclosure is to provide a circuit substrate with improved warpage preventing characteristics. A method of manufacturing a warpage preventing circuit substrate is also provided.

In one embodiment, a circuit substrate comprises a substrate; and a warpage preventing pattern disposed on the substrate. The warpage preventing pattern comprises a first pattern at a first corner of the substrate and a second pattern at a second corner of the substrate. The first corner and the second corner are disposed adjacent to each other. An overall orientation of the first pattern is different from an overall orientation of the second pattern with respect to the substrate. The warping of a semiconductor package can be significantly reduced by cutting off stress lines in the corners of the circuit substrate.

BRIEF DESCRIPTION OF THE DRAWINGS

The above and other features and advantages of the invention will become more apparent by describing in detail exemplary embodiments thereof with reference to the accompanying drawings, in which.

DETAILED DESCRIPTION

Figure 1:
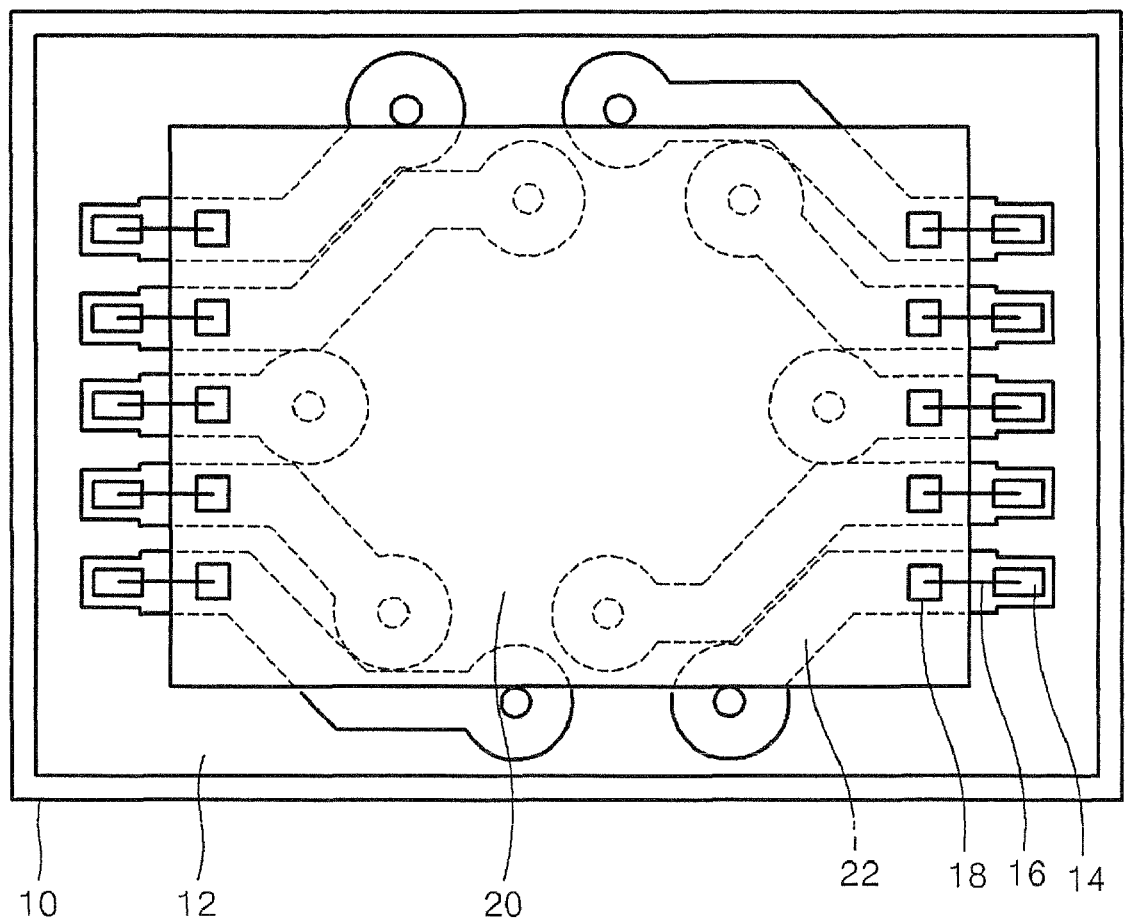
FIG. 1 is a plan view of a conventional semiconductor chip package including a semiconductor chip.
Figure 2:
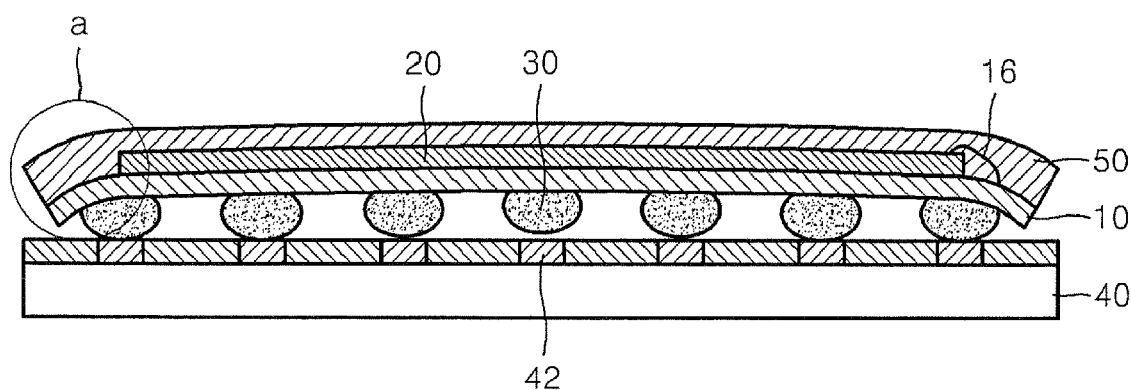
FIG. 2 is a cross-section view of a conventional electronic device including the chip package shown in FIG. 1.
Figure 3A:
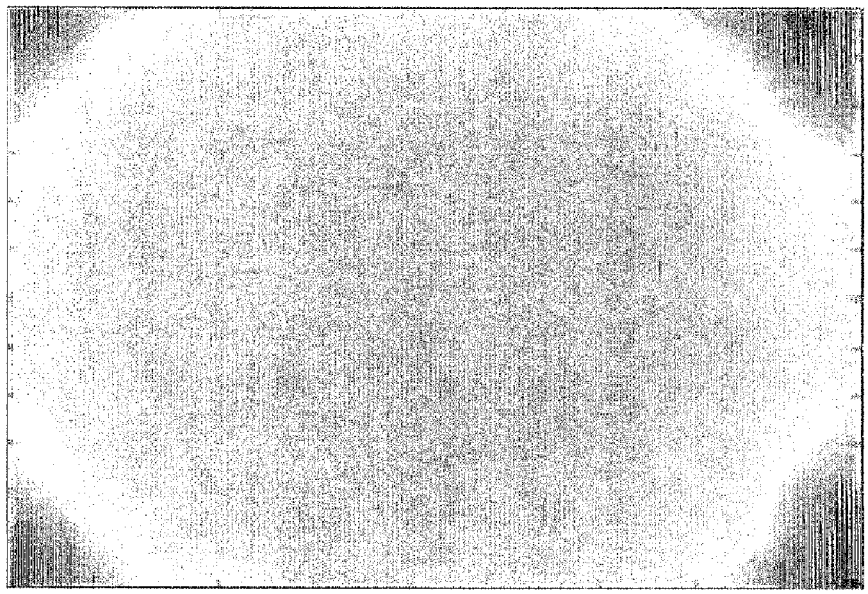
FIGS. 3a and 3b are stress contour graphs of a circuit substrate.
Figure 3B:
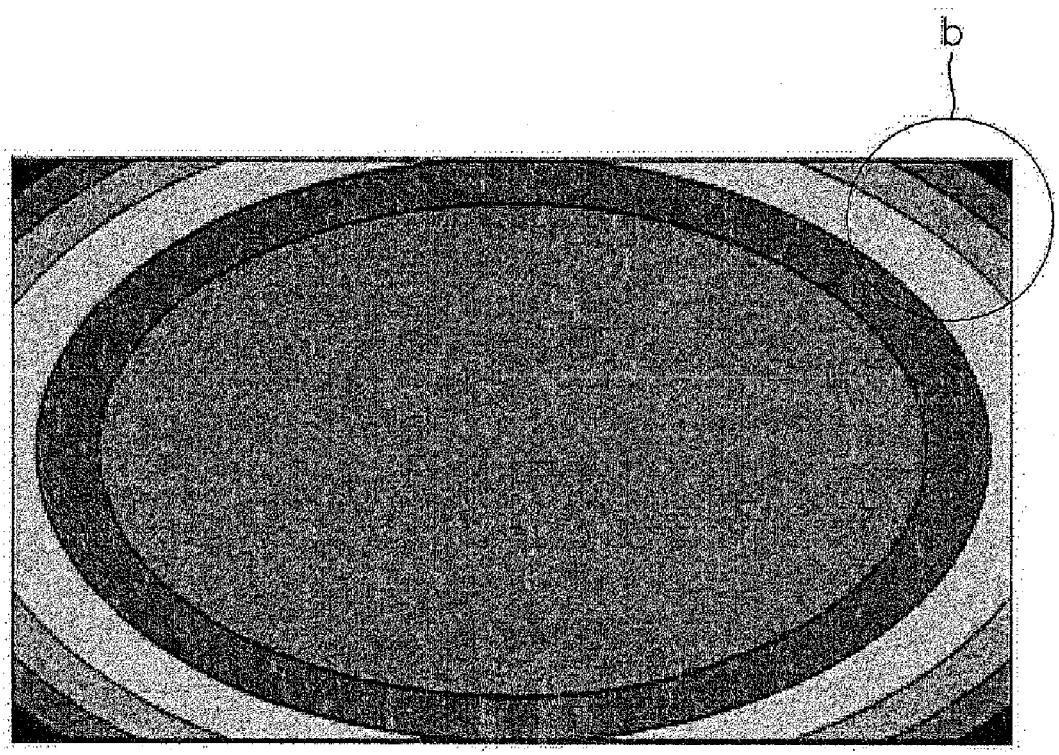

The invention is described more fully hereinafter with reference to the accompanying drawings, in which various embodiments of the invention are shown. This invention may, however, be embodied in many different forms and should not be construed as limited to the particular embodiments set forth herein. Rather, these embodiments are provided so that this disclosure will be thorough and complete, and will convey the scope of the invention to those skilled in the art. In the drawings, the size and relative sizes of layers and regions may be exaggerated for clarity.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
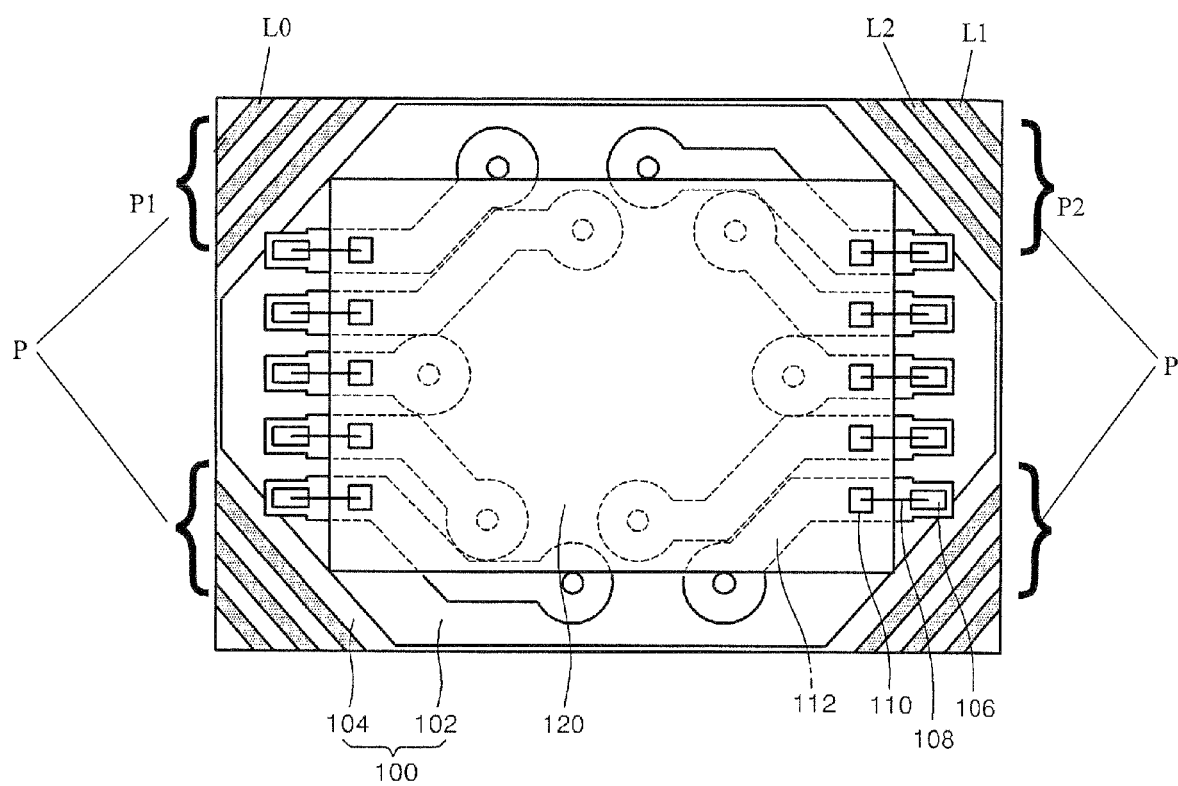
FIG. 4 is a plan view of a semiconductor chip package according to an embodiment of the invention.

FIG. 4 is a plan view of a semiconductor chip package according to an embodiment of the invention utilizing some of the inventive concepts described below with reference to FIGS. 5 and 6.

Referring to FIG. 4, a semiconductor chip package includes a circuit substrate 100 and a semiconductor chip 120. The circuit substrate 100 includes a conductive pattern region 102 and a warpage preventing region 104 each defined in the circuit substrate 100. The warpage preventing region 104 may be defined by the conductive pattern region 102 in corners or periphery of the circuit substrate 100 and the conductive pattern region 102 may be defined in, for example, an interior region of the circuit substrate 100 adjacent the warpage preventing region 104. The circuit substrate 100 may include an insulating core substrate, e.g., one or more PCBs or it may be a film-type package substrate. The circuit substrate 100 may be a type of substrate suitable for use in a wide variety of electronic devices such as a memory device for mobile applications or personal computers, a display device, or a display driver IC (DDI) device. The conductive pattern region 102 includes a conductive pattern 112, which may include a bond finger 106 and a solder ball pad (not labeled). The conductive pattern region 102 may also include a dummy pattern (not shown). When the conductive pattern region 102 includes the dummy pattern, the dummy pattern is not disposed in a region where the conductive pattern 112 and the bond finger 106 are formed. The dummy pattern may be formed in the shape of, for example, a plane, a mesh or an island. The semiconductor chip 120 may include a bond pad 110 and a conductive wire 108 that connects the bond pad 110 to the bond finger 106. One skilled in the art will appreciate that other known methods such as flip chip bonding can be used to connect the bond pad 110 to the bond finger 106.

The warpage preventing region 104 may have any shape suitable to be located on the corners of the package substrate 100 and may, for instance, have a triangular shape. The shape of the warpage preventing region 104 may also be varied depending on the location of the corners of the circuit substrate 100. Further, to better dissipate the stress, the interface area where the conductive pattern region 102 and the warpage preventing region 104 meet can be rounded or arc-shaped, although not illustrated. The size of the warpage preventing region 104 can be varied as necessary to accommodate the conductive pattern region 102.

A warpage preventing pattern P may be disposed at some or all of the corners of the circuit substrate 100. For example, the warpage preventing patterns P may be formed on three or four corners if the circuit substrate 100 has a rectangular shape.

The warpage preventing pattern P may include a first warpage preventing pattern P1 at a first corner of the circuit substrate 100 and a second warpage preventing pattern P2 at a second corner of the circuit substrate 100. The first and second corners of the circuit substrate 100 may be any two adjacent corners of the circuit substrate 100. The first and second patterns P1, P2 may include one or more warpage preventing members L0, L1 as will be explained further. The first and second patterns P1, P2 may be disconnected from each other.

According to one aspect of the invention, the overall orientation of the first pattern P1 with respect to the circuit substrate 100 may be different than the overall orientation of the second pattern P2 with respect to the circuit substrate 100. Here, an edge, a corner, or the whole body of the substrate 100 can be a reference point when determining the orientation of the first and second patterns P1 and P2 with respect to the circuit substrate 100. For example, the overall orientation of the warpage preventing members of the first pattern P1 is different from the overall orientation of the warpage preventing members of the second pattern P2. In this respect, the warpage preventing members of the first pattern P1 collectively define a first orientation at the first corner of the substrate 100 and the warpage preventing members of the second pattern P2 collectively define a second orientation at the second corner of the substrate 100. In FIG. 4, the first pattern P1 may be generally oriented from a bottom-left side to a top-right side with respect to the substrate 100 or vice versa; and the second pattern P2 may be generally oriented from a bottom-right side to a top-left side or vice versa.

In some embodiments, substantially all of the warpage preventing members in the first corner may be arranged in substantially the same orientation with respect to the substrate 100 and substantially all of the warpage preventing members in the second corner are arranged in substantially the same orientation with respect to the substrate 100. For example, substantially all of the warpage preventing members in the first corner are arranged in the first orientation, e.g., from a bottom-left side to a top-right side or vice versa and substantially all of the warpage preventing members in the second corner are arranged in the second orientation, e.g., from a bottom right side to a top-left side or vice versa.

In some cases, one skilled in the art will appreciate that some of the warpage preventing members may be oriented differently from the rest of the warpage preventing members.

In one aspect, the longitudinal axis of at least some portion of the first pattern P1 may be disposed at an angle with respect to the longitudinal axis of at least some portion of the second pattern P2.

In FIG. 4, the warpage preventing pattern P is shown to be a straight line type as will be explained further. However, if the warpage preventing pattern P comprises one or more arcs as shown in, for example, FIG. 15, the overall orientation of the warpage preventing pattern P can be determined by an orientation of a chord, i.e., a straight line joining two points on a curve of the arc. The overall orientation of the warpage preventing pattern P having shapes other than a straight line or an arc can be determined using the method to determine the orientation of the arc discussed above.

In yet another aspect, at least some portion of the first pattern P1 may extend along a direction substantially orthogonal to an axis bisecting the first corner. Also, the second pattern P2 may extend along a direction substantially orthogonal to an axis bisecting the second corner.

Some of the elements of the semiconductor chip package may be disposed on one side of the circuit substrate 100 and other elements may be disposed on the other side of the circuit substrate 100. As an example, the bond finger 106 may be disposed on a first side of the circuit substrate 100 and the solder ball pad may be disposed on a second, opposite, side of the circuit substrate 100. Further, the dummy pattern and/or the warpage preventing pattern P may be disposed on one side or the other of the circuit substrate 100, or it may be disposed on both sides. When the circuit substrate 100 comprises more than one layer, the warpage preventing pattern P may be disposed on more than one layer although not illustrated. In particular, when the circuit substrate 100 includes a multi-layer PCB, the warpage preventing pattern P can be formed in any of the lower-most layer, upper-most layer, or middle-layer of the multi-layer PCB. Thus, the first pattern P1 may be formed on a different layer of the multi-layer PCB than the second pattern P2. The warpage preventing pattern P may be formed by screen printing, plating, photolithography, or other suitable processes.

As shown in FIG. 4, at least some of the warpage preventing patterns P in some or all of the corners of the circuit substrate 100 may include one or more warpage preventing members, e.g., L1, L2. All or some of the warpage preventing members, e.g., L1, L2, may run substantially parallel to each other. Also, some of the warpage preventing members may form an acute or obtuse angle with other warpage preventing members in the same corner as illustrated in, for example, FIG. 6 or FIG. 10. The warpage preventing members may be made of the same material as the conductive pattern 112 and may be, for example, approximately 100 microns wide. The width of the warpage preventing members may be greater or smaller than 100 microns depending on applications. Additionally, the warpage preventing members L1, L2 may be arranged by orders in a single warpage preventing pattern e.g., P1, P2. For instance, the warpage preventing member L1 closest to the corner may be called a first order warpage preventing member, the warpage preventing member L2 next closest to the corner may be called a second order warpage preventing member, and so on. Each corner warpage preventing pattern P1 or P2 may include warpage preventing members that correspond in order to other warpage preventing members of the other warpage preventing patterns. The length of the warpage preventing members, e.g., L1, L2 may increase incrementally from the corners of the circuit substrate 100. In other words, warpage preventing members L1 disposed closer to the corners of the substrate 100 may be smaller than warpage preventing members L2 disposed farther from the corners of the substrate 100.

In some embodiments of the invention, at least one of the warpage preventing members may make an approximately 90 degree angle with an axis extending from the center area of the substrate 100 to the first corner as explained with respect to FIG. 6 below.

The warpage preventing members may extend up to the edge of the circuit substrate 100 or the warpage preventing members may only extend close to (not in contact with) the edge of the circuit substrate 100. When photolithography is used to form the warpage preventing members, the warpage preventing members do not extend all the way to the edge of the circuit substrate 100. Thus, one or both ends of the first or second pattern are spaced apart from the edges that form the corners.

In some embodiments, the warpage preventing members can be a substantially straight line, a meandering line, angled, rounded, partially rounded, or combinations thereof. In particular, the warpage preventing members can be a partially straight line and/or a partially rounded line. The warpage preventing members can have a uniform width or the width can be varied along the long axis of the warpage preventing pattern P. The spacing between the warpage preventing members can be approximately the same as the width of the warpage preventing members, but this is not necessary. The pitch of the warpage preventing members can be varied depending on the magnitude of the stress in the conductive pattern region 102. The number of warpage preventing members in the warpage preventing pattern P may be varied depending on the type or size of the semiconductor chip package. If the stress is higher in the conductive pattern region 102, then more warpage preventing members may be used.

According to the embodiment shown in FIG. 4, the warpage preventing members, e.g., L1, L2 are of a straight-line shape. In this embodiment, the ends of the straight-line warpage preventing members terminate at the edges of the circuit substrate 100. In other words, according to one aspect of the invention, the longitudinal axis of at least some portion of the patterns, e.g., P1, P2, is orientated to intersect two sides or edges that form the corners of the circuit substrate 100.

All or some of the above aspects of the present invention described with reference to FIG. 4 can be applied to other embodiments of the present invention described below with reference to FIGS. 6 to 22.

Figure 5:
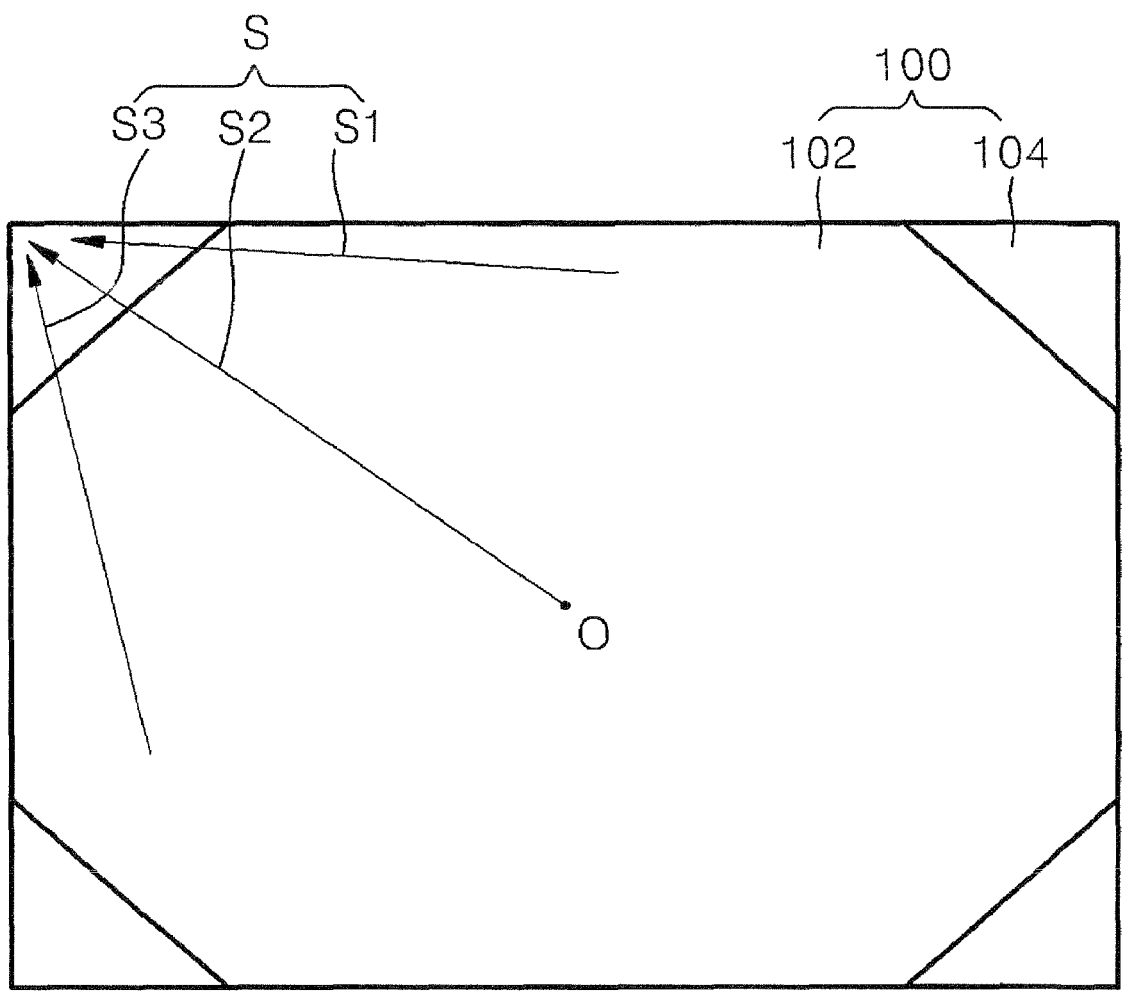
FIG. 5 is a schematic view of a circuit substrate showing lines of stress.

FIG. 5 is a schematic view of a circuit substrate showing lines of stress to further illustrate the concept of the present invention.

Referring to FIG. 5, the conductive pattern region 102 and the warpage preventing region 104 may have different coefficients of thermal expansion (CTE). Additionally, the circuit substrate 100 and the semiconductor chip 120 may have different CTEs. This difference in CTE causes stress in the chip package during heating processes such as a solder reflow process for surface mounting of the chip package to a circuit board. The total stress S experienced at a corner of the chip package is a combination of the long edge stress S1, the center stress S2, and the short edge stress S3. In FIG. 6, S2 indicates a stress generated from the center area, an area adjacent the point O of the circuit substrate 100 and S1 and S3 indicate stresses generated from regions adjacent to the corners of the circuit substrate 100. These different stresses combine to form a stress field. A function of the warpage preventing pattern P is to significantly reduce stress concentration at the corners of the circuit substrate 100 by cutting across, or intersecting, the lines of stress extending from the conductive pattern region 102 toward each of the corners. The warpage preventing pattern P may cross the stress lines at some angle. Preferably, the warpage preventing pattern P crosses the stress lines at an approximately 90 degree angle (a right angle), but this specific configuration is not necessary as long as the warpage preventing pattern P does not run parallel to the stress lines at least at some portions thereof. In other words, the long axis (or a longitudinal axis) or the direction of the arc of the warpage preventing pattern P cuts across the stress lines. In this way, when the stress line meets the warpage preventing pattern P, the direction of the stress is changed or the stress is dissipated, thus minimizing or significantly reducing the warpage of the circuit substrate 100. By intersecting the lines of stress, the warpage preventing pattern P opposes the stress fields directed from, e.g., the interior region of the substrate 100 to the corners of the substrate 100. This results in less warpage of the chip package during heating processes or solder reflow processes. Also, in some embodiments, when the warpage preventing members that form the warpage preventing pattern P are spaced apart or disconnected from each other as shown in, for example, FIG. 4, the stress that causes warping of the substrate 100 can be blocked even more efficiently. For example, (although applicant does not wish to be held to a particular theory of operation) applicant believes that if the warpage preventing members were connected, the stress fields could move through the connected warpage preventing members all the way to the corners. In other words, if the warpage preventing members were connected, they might channel the stress fields to the corners of the substrate rather than blocking the stress fields. In this case, the warpage preventing members would not reduce the stress in the corners of the substrate very effectively. However, according to some embodiments of the invention, the stress lines or fields can be blocked every time they meet a warpage preventing member intersecting them. When the warpage preventing members comprise a different material than the circuit substrate, the stress lines or fields can be blocked more efficiently as they pass through the different materials toward the corner of the substrate. Specifically, the stress lines or fields may be diminished or dissipated as they pass through successive material interfaces that are not interconnected. In this way, the multiple, disconnected warpage preventing members of the invention can efficiently block the stress lines or fields, thereby preventing them from concentrating at the corners of the substrate.

Figure 6:
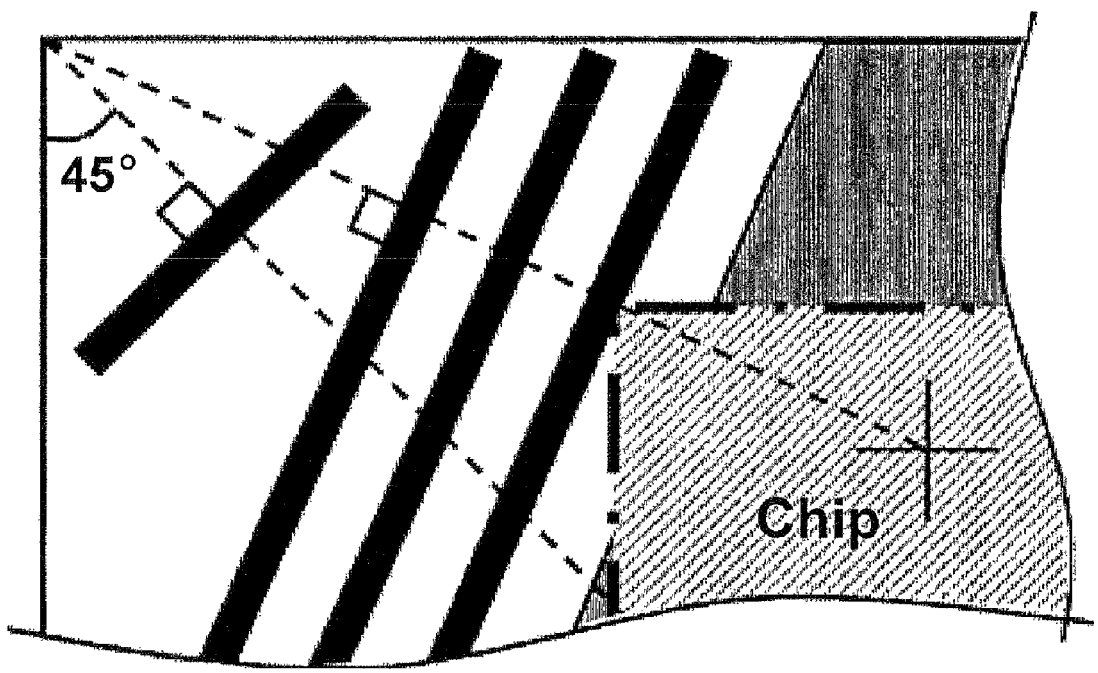
FIG. 6 is an exploded view of the corner of a circuit substrate incorporating some embodiments of the invention.

FIG. 6 is an exploded view of one example corner of a circuit substrate incorporating some embodiments of the invention to explain the basic concept of the invention in further detail.

Referring to FIG. 6, warpage preventing patterns of the present invention may be formed in the corner regions of the circuit substrate 100 and may extend in a direction substantially orthogonal to an axis bisecting the corner of the circuit substrate 100. Warpage preventing patterns may also extend in a direction orthogonal to an axis extending from the center are of the circuit substrate 100 to the corner. By having warpage preventing patterns extending in these and other directions on the circuit substrate 100, stress lines extending from the interior portion of a circuit substrate to the corners can be effectively blocked. However, the warpage preventing patterns need not be orthogonal to the stress lines as long as the stress lines can be effectively blocked to reduce the warping of the circuit substrate 100. Therefore, the stress lines may just need to form an acute or obtuse angle with the longitudinal axis of the warpage preventing members.

Figure 7:
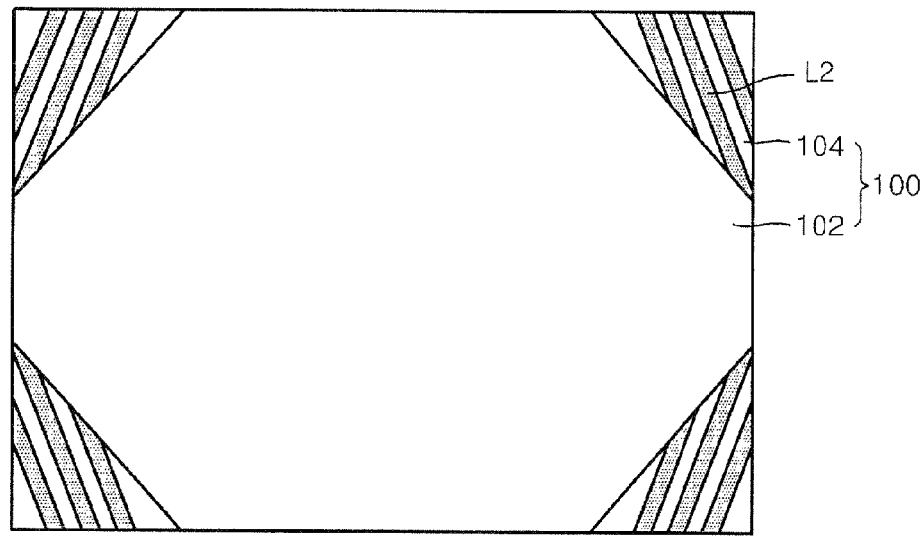
FIG. 7 is a plan view of a circuit substrate illustrating the warpage preventing pattern terminating at the conductive pattern region according to an embodiment of the invention.

FIG. 7 is a plan view of a circuit substrate illustrating the warpage preventing members, e.g., L2 of the warpage preventing pattern terminating at the conductive pattern region 102 according to an embodiment of the invention.

Referring to FIG. 7, one of the warpage preventing members L2 of a warpage preventing pattern may contact the conductive pattern region 102. Specifically, one end of the warpage preventing member L2 may contact the conductive pattern region 102 rather than contacting the edge of the circuit substrate 100. In this example embodiment, the warpage preventing member L2 has a different angle with respect to the side of the circuit substrate 100 than the warpage preventing members of the warpage preventing pattern P described with respect to FIG. 4 above.

Figure 8:
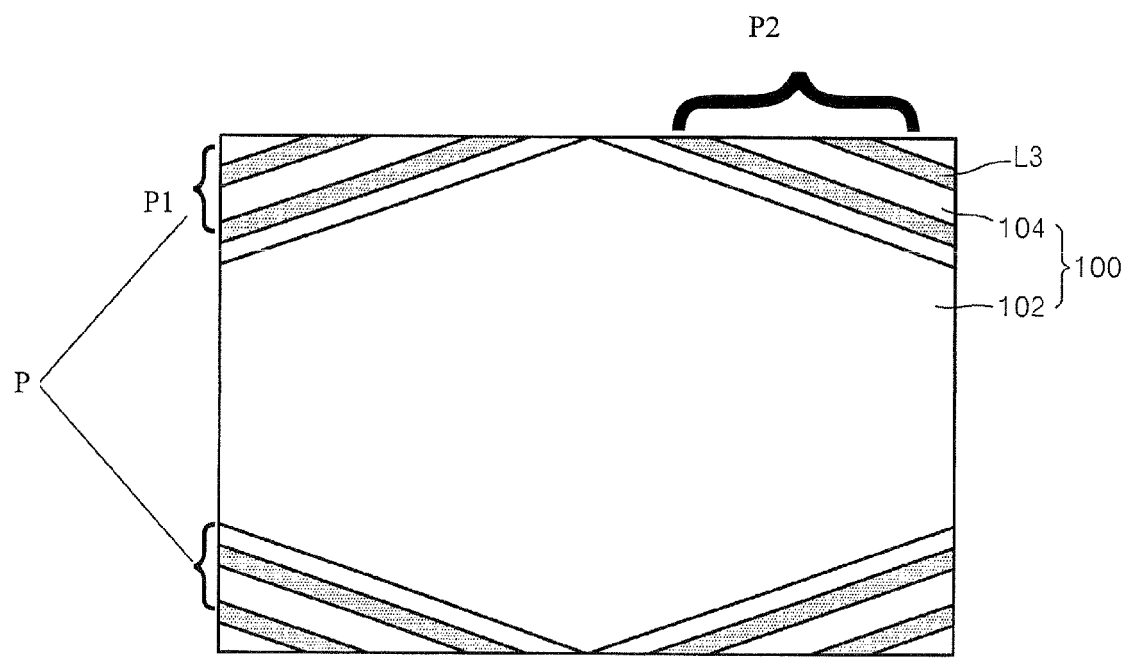
FIG. 8 is a plan view of a circuit substrate illustrating the warpage preventing pattern from different corners meeting on the long edge of the circuit substrate according to an embodiment of the invention.

FIG. 8 is a plan view of a circuit substrate 100 illustrating the warpage preventing pattern P from different corners meeting on the long edge of the circuit substrate according to another embodiment of the invention.

Referring to FIG. 8, the warpage preventing region 104 (or the warpage preventing patterns P1, P2 although not illustrated) from adjacent corners may meet along the long edge of the circuit substrate 100. The intersection point is shown in FIG. 8 as being approximately in the center of the long edge, but the intersection point could be at a different point along the long edge. As shown in FIG. 8, the triangular warpage preventing region 104 has an oblique side longer than those of FIGS. 4 and 7, discussed previously. The warpage preventing members L3 may extend substantially parallel to the longer oblique side of the warpage preventing region 104 or they may intersect the longer oblique side.

Figure 9:
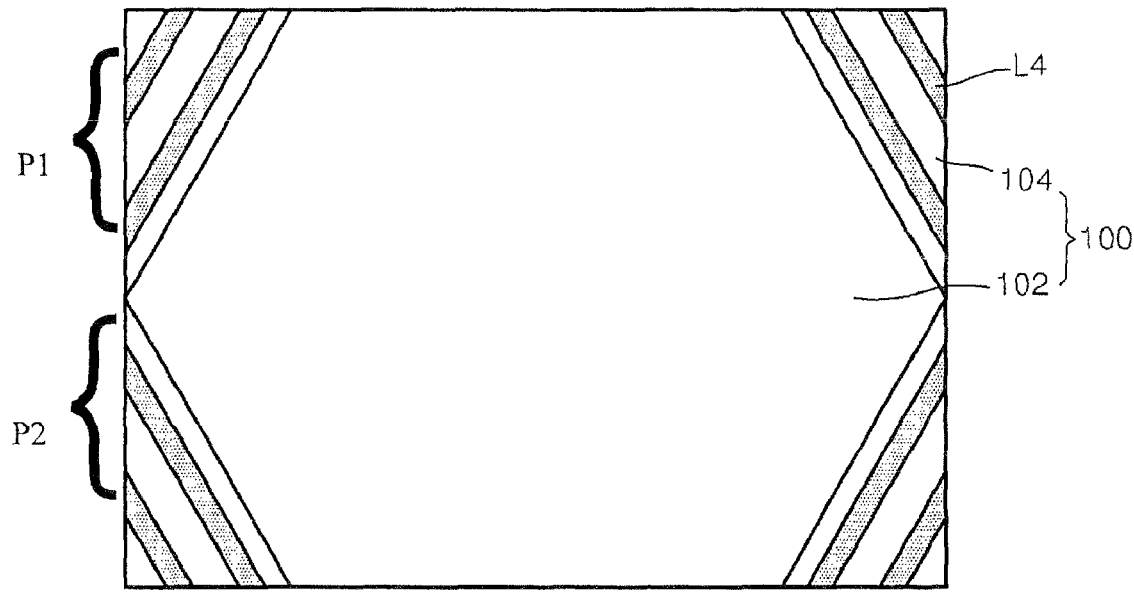
FIG. 9 is a plan view of a circuit substrate illustrating the warpage preventing pattern from different corners meeting on the short edge of the circuit substrate according to an embodiment of the invention.

FIG. 9 is a plan view of a circuit substrate 100 illustrating the warpage preventing region 104 (or warpage preventing pattern P1, P2 although not illustrated) from different corners meeting on the short edge of the circuit substrate according to yet another embodiment of the invention.

Referring to FIG. 9, the warpage preventing patterns P1, P2 from adjacent corners may meet along the short edge of the circuit substrate 100. The two adjacent warpage preventing patterns P1, P2 may also meet the conductive pattern region 102 at a point along the short edge of the circuit substrate 100 although not shown. The intersection point is shown in FIG. 9 as being approximately in the center of the short edge, but the intersection point could be at a different point along the short edge. As shown in FIG. 9, the triangular warpage preventing region 104 has an oblique side longer than those of FIGS. 4 and 7, discussed previously. The warpage preventing members L4 may extend substantially parallel to the longer oblique side of the warpage preventing region 104 or, alternatively, they may intersect the longer oblique side.

Figure 10:
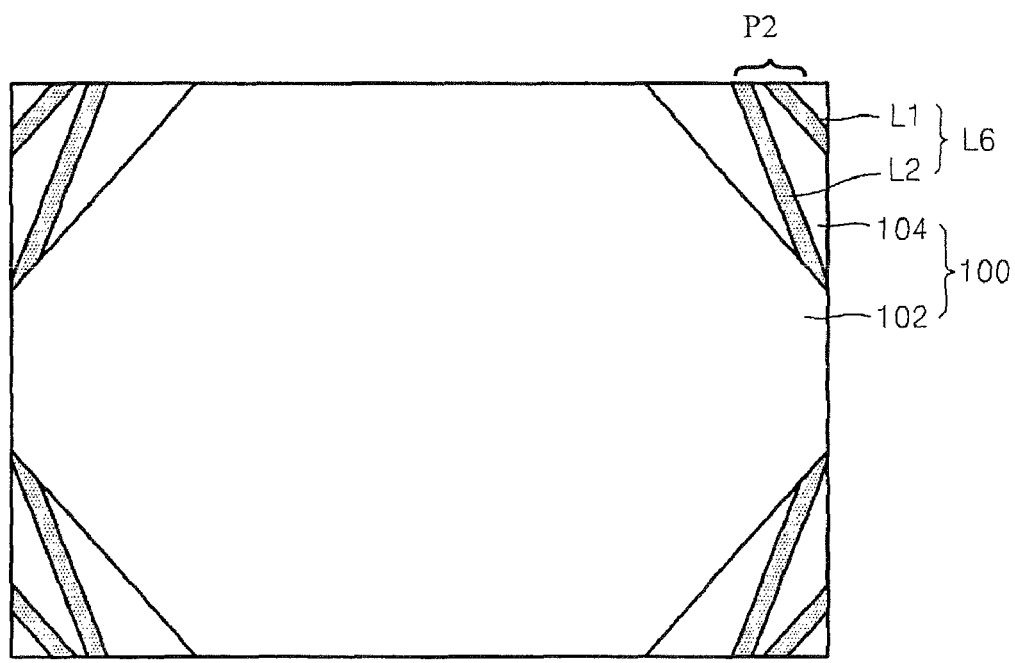
FIG. 10 is a plan view of a circuit substrate illustrating one warpage preventing pattern having a different slope from another warpage preventing pattern according to an embodiment of the invention.

FIG. 10 is a plan view of a circuit substrate 100 illustrating one warpage preventing member having a different slope from another warpage preventing member in the same corner according to still another embodiment of the invention.

Referring to FIG. 10, one warpage preventing member L2 may have a different slope than another warpage preventing member L1 within a single warpage preventing pattern P2 in the same corner. Specifically, the warpage preventing member L2 may be at an angle with respect to the warpage preventing member L1. In other words, the warpage preventing members of at least one order may be disposed at an angle with respect to the warpage preventing members of at least one other order. Having warpage preventing members at different angles within a single warpage preventing pattern P2 may help distribute the stresses from the long and short sides of the circuit substrate 100. Specifically, the stress coming into the corner from various directions can be effectively blocked by the warpage preventing members L1 and L2 having an angle with respect to each other.

Figure 11:
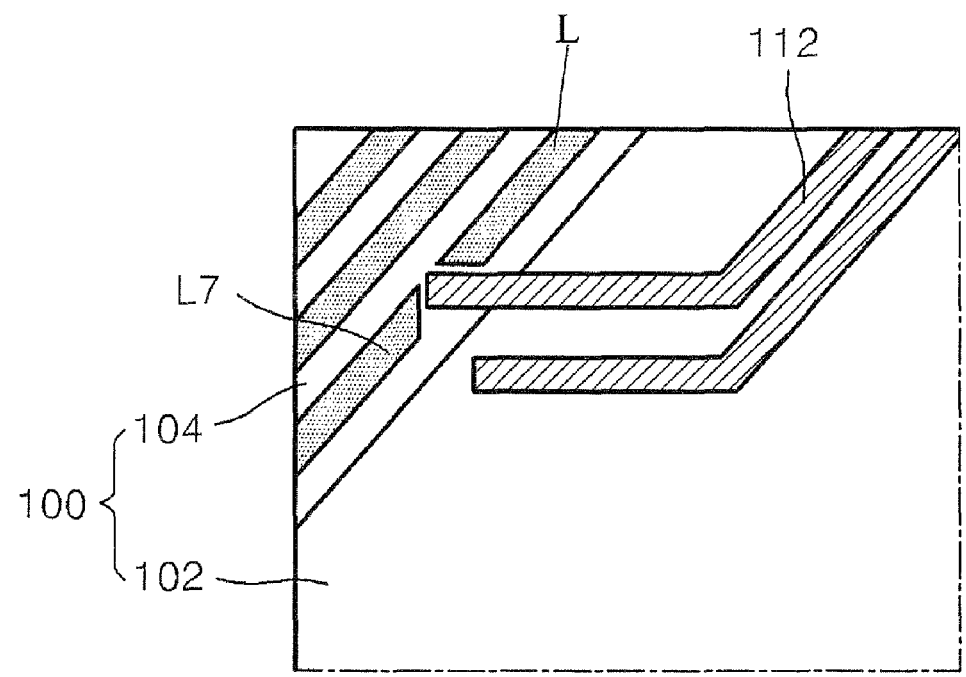
FIG. 11 is a plan view of a circuit substrate illustrating a conductive pattern penetrating a warpage preventing pattern according to an embodiment of the invention.

FIG. 11 is a plan view of a circuit substrate illustrating a conductive pattern penetrating a warpage preventing pattern according to one embodiment of the invention.

Referring to FIG. 11, the conductive pattern 112 may penetrate into the warpage preventing pattern P. The conductive pattern 112 may divide one or more warpage preventing members into warpage preventing sub-members L7. A single warpage preventing member may be divided into two warpage preventing sub-members. This configuration may help conserve surface area of the circuit substrate 100 for the conductive pattern 112, thereby allowing for a smaller overall semiconductor chip package. In other words, having the conductive pattern 112 penetrate into the warpage preventing pattern P may allow for greater design flexibility.

Figure 12:
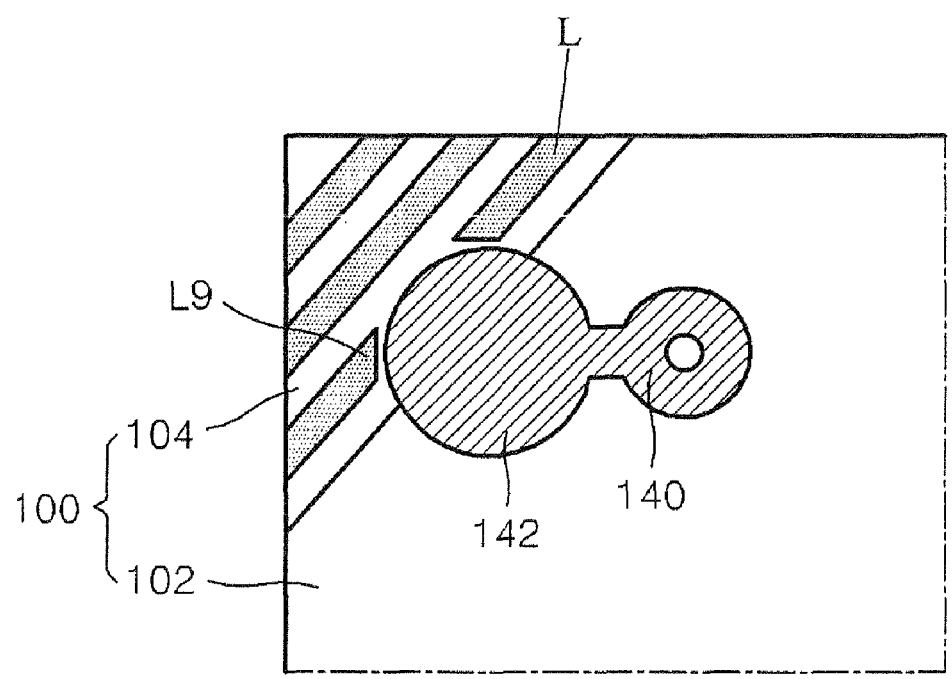
FIG. 12 is a plan view of a circuit substrate illustrating a solder ball pad penetrating a warpage preventing pattern according to an embodiment of the invention.

FIG. 12 is a plan view of a circuit substrate illustrating a solder ball pad penetrating a warpage preventing pattern according to still another embodiment of the invention.

Referring to FIG. 12, a solder ball pad 142 may penetrate into the warpage preventing member. The solder ball pad 142 may divide one or more warpage preventing members into warpage preventing sub-members L9. A single warpage preventing member L may be divided into two warpage preventing sub-members.

Figure 13:
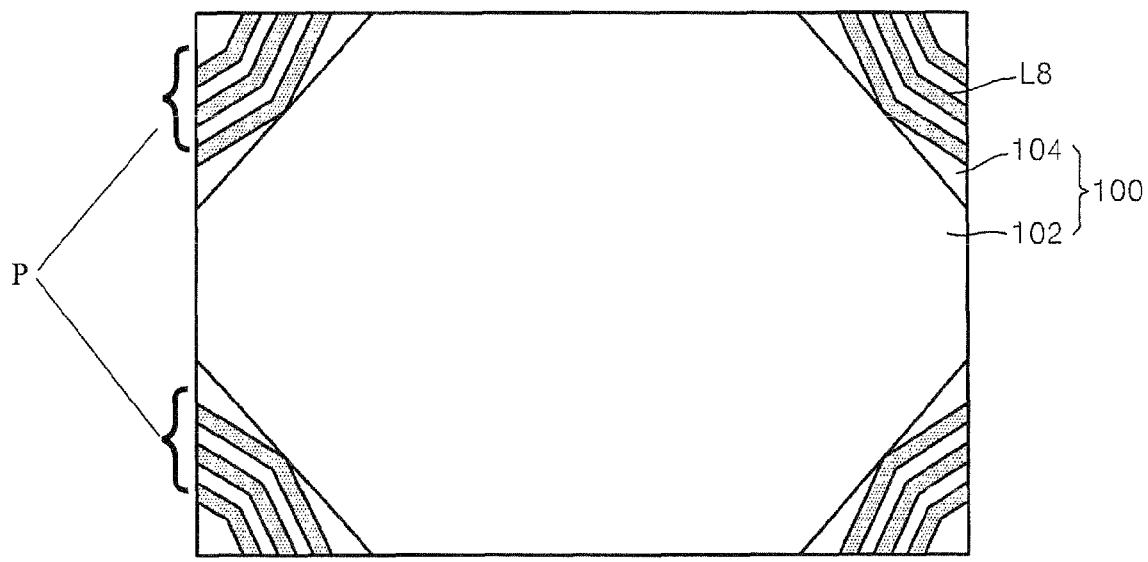
FIGS. 13 and 14 are plan views of a circuit substrate illustrating warpage preventing patterns having angled warpage preventing members according to some embodiments of the invention.
Figure 14:
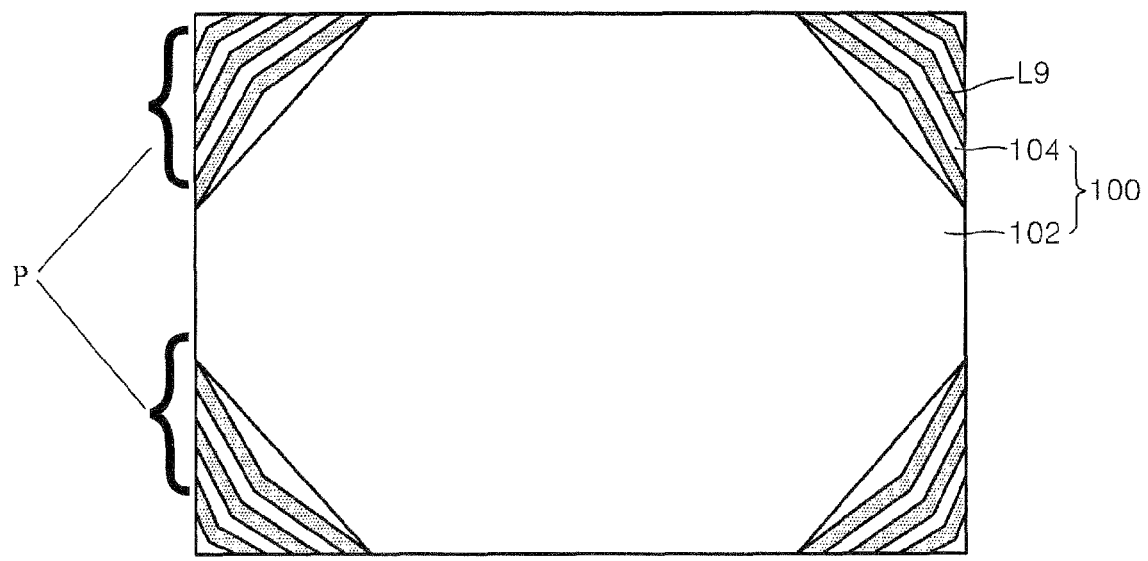

FIGS. 13 and 14 are plan views of a circuit substrate 100 illustrating warpage preventing patterns P having angled warpage preventing members according to some embodiments of the invention.

Referring to FIGS. 13 and 14, the warpage preventing members L8, L9 may be angle-shaped. The points of the angle-shaped warpage preventing members L8, L9 may point toward the conductive pattern region 102, (L8) or center area of the substrate 100 as shown in FIG. 13, or they may point toward the corner of the circuit substrate 100 (L9) as shown in FIG. 14. The angle-shaped warpage preventing members L8, L9 may effectively dissipate or block stress lines approaching the corner from different directions.

Figure 15:
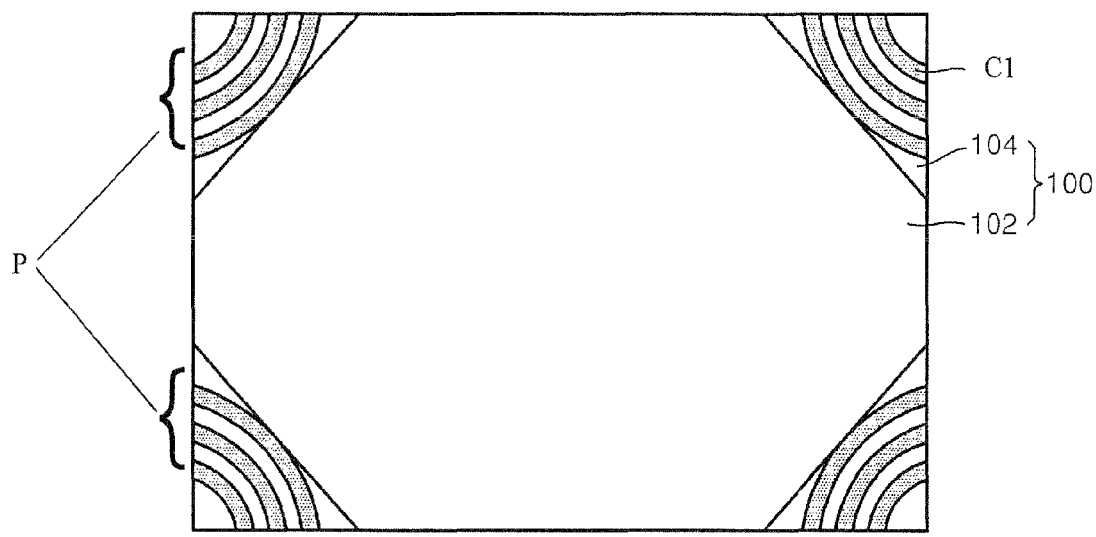
FIGS. 15 and 16 are plan views of a circuit substrate illustrating warpage preventing patterns having arc-shaped warpage preventing members according to some embodiments of the invention.
Figure 16:
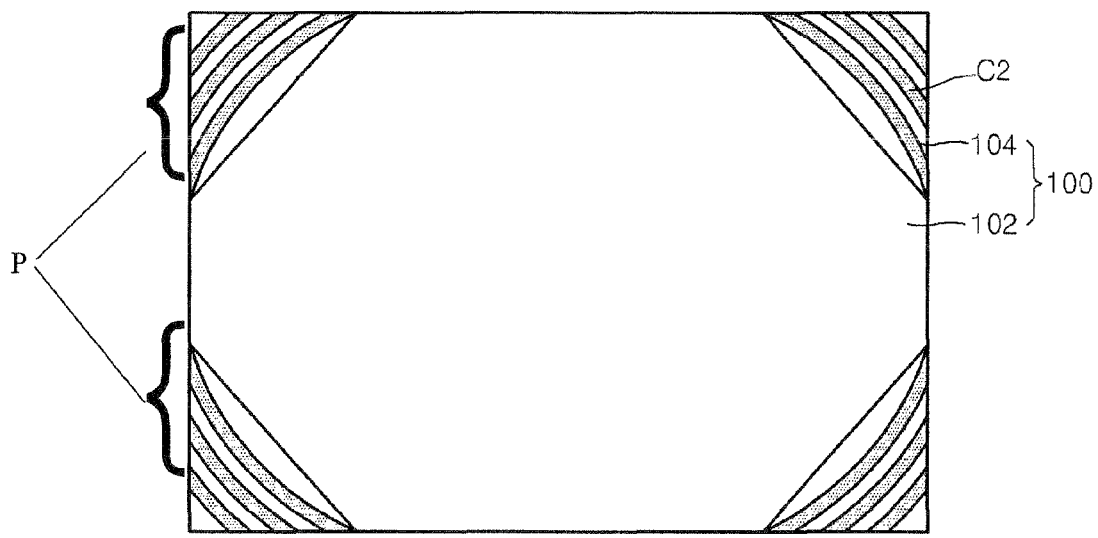

FIGS. 15 and 16 are plan views of a circuit substrate illustrating warpage preventing patterns P having arc-shaped warpage preventing members according to some embodiments of the invention.

Referring to FIGS. 15 and 16, the warpage preventing members may be arc-shaped. The concave portions of the arc-shaped warpage preventing members may point toward the corner of the circuit substrate (C1) as shown in FIG. 15 or they may point toward the conductive pattern region (C2) or center area of the circuit substrate 100, as shown in FIG. 16. The arc-shaped warpage preventing members C1, C2 may effectively dissipate or block stress lines approaching the corner from many different directions.

Figure 17:
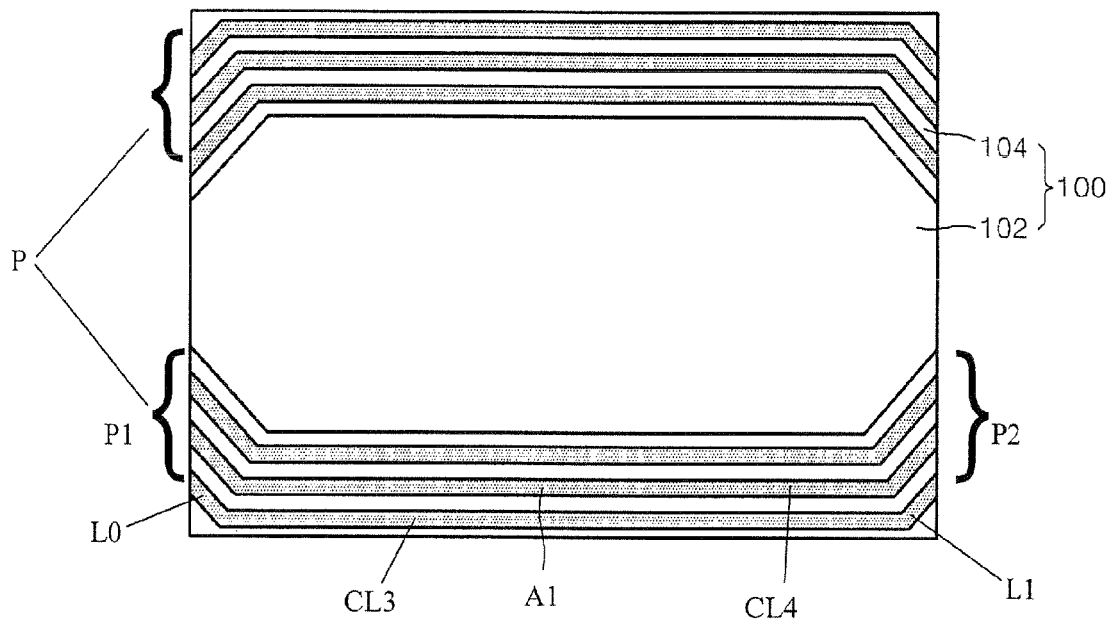
FIG. 17 is a plan view of a circuit substrate illustrating the warpage preventing pattern from different corners connected by a subsidiary pattern along a long edge of the circuit substrate according to an embodiment of the invention.

FIG. 17 is a plan view of a circuit substrate 100 illustrating the warpage preventing pattern P from different corners connected by a subsidiary pattern A1 along a long edge of the circuit substrate 100 according to an embodiment of the invention.

Referring to FIG. 17, adjacent warpage preventing patterns P may be connected by a subsidiary pattern A1 along a long edge of the circuit substrate 100. The subsidiary pattern A1 along a long edge of the circuit substrate 100 may include warpage preventing members CL3, CL4 that are arranged into orders, similar to the first and second patterns P1, P2 discussed with respect to FIG. 4 above. In this case, the warpage preventing members L0, L1 of the first pattern P1 and the second pattern P2 may be connected to the warpage preventing members CL3 of the subsidiary pattern C1 such that corresponding orders are connected together. This arrangement may be particularly useful when the semiconductor chip 120 is rectangular in shape and is elongated along the long edge of the circuit substrate 100.

Figure 18:
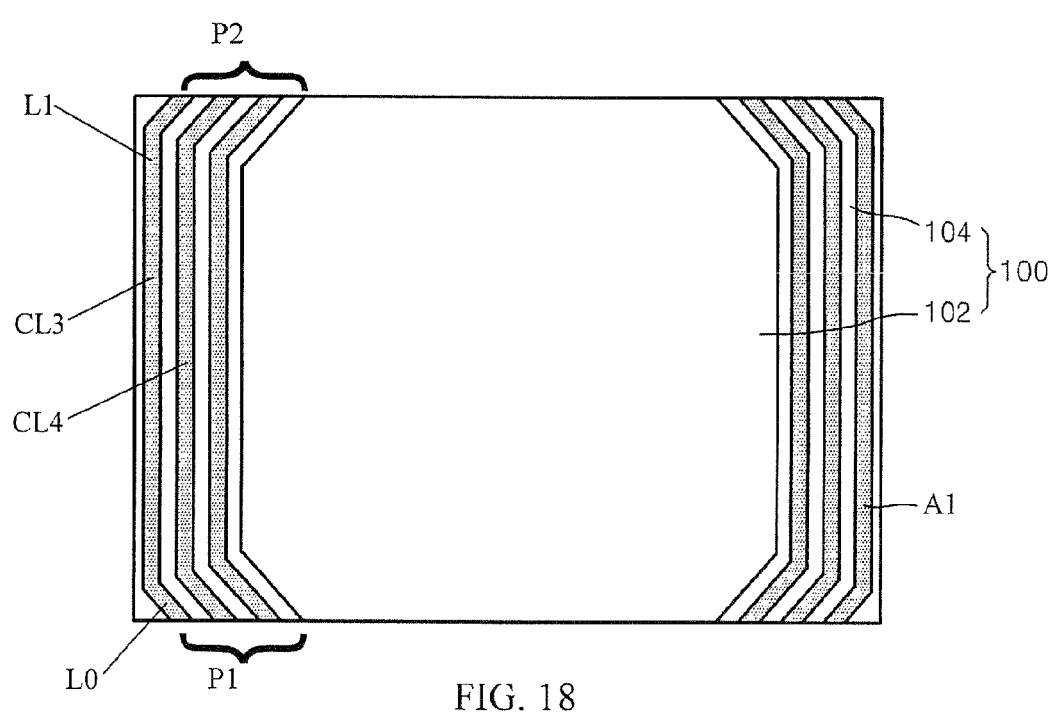
FIG. 18 is a plan view of a circuit substrate illustrating the warpage preventing pattern from different corners connected by a subsidiary pattern along a short edge of the circuit substrate according to an embodiment of the invention.

FIG. 18 is a plan view of a circuit substrate 100 illustrating the warpage preventing pattern P from different corners connected by a subsidiary pattern A1 along a short edge of the circuit substrate 100 according to another embodiment of the invention.

Referring to FIG. 18, adjacent warpage preventing patterns P1, P2 may be connected by a subsidiary pattern A1 along a short edge of the circuit substrate 100. The subsidiary pattern A1 along a short edge of the circuit substrate 100 may include warpage preventing members CL3, CL4 that are arranged into orders, similar to the first and second patterns P1, P2 discussed with respect to FIG. 4 above. In this case, the warpage preventing members L0, L1 of the first pattern P1 and the second pattern P2 may be connected to the warpage preventing members CL3 of the subsidiary pattern A1 such that corresponding orders are connected together. This arrangement may be particularly useful when the semiconductor chip 120 is rectangular in shape and is elongated along the short edge of the circuit substrate 100.

Figure 19:
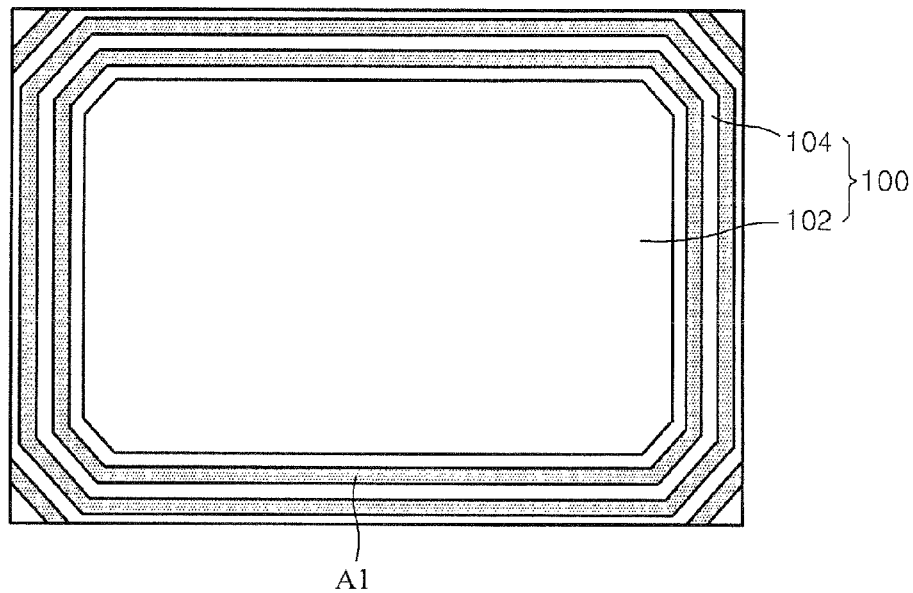
FIG. 19 is a plan view of a circuit substrate illustrating warpage preventing members of the same order connected together according to an embodiment of the invention.

FIG. 19 is a plan view of a circuit substrate 100 illustrating warpage preventing members of the same order connected together according to still another embodiment of the invention.

Referring to FIG. 19, all of the warpage preventing patterns may be connected together by subsidiary patterns A1. For example, all of the warpage preventing members of a specific order may be connected together. This arrangement may be particularly useful for an LCD Driver IC (LDI), as the size of the semiconductor chip 120 is small and has numerous interconnection patterns extending from its long sides.

Figure 20:
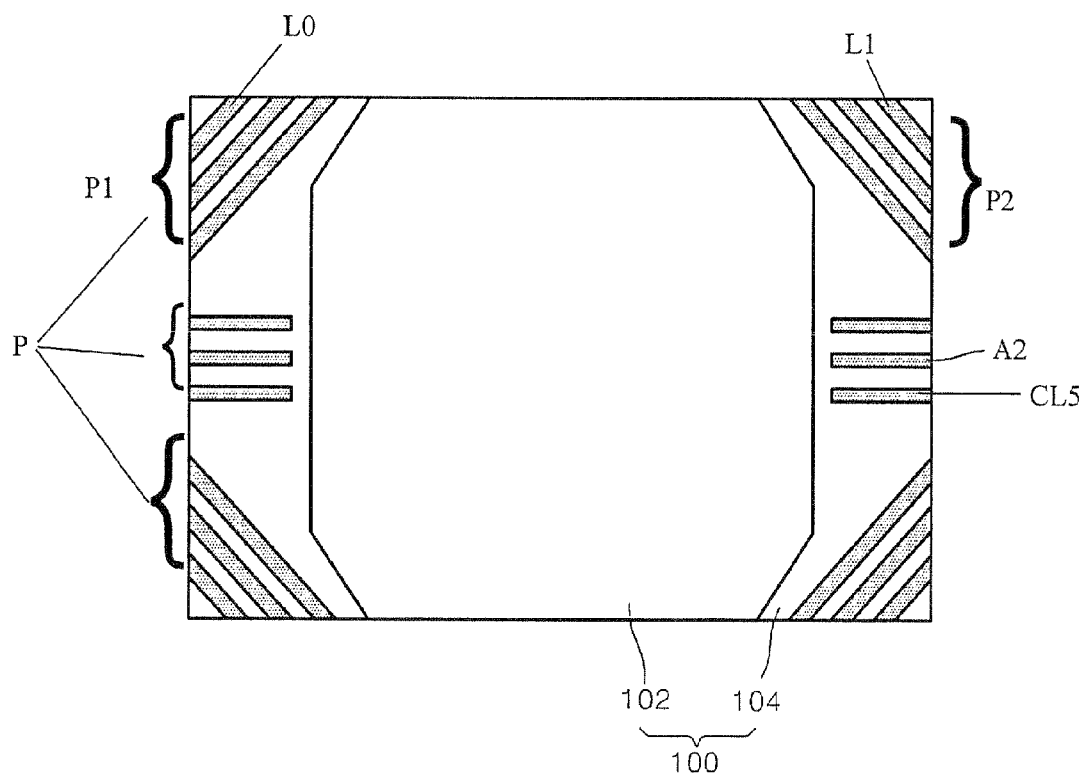
FIG. 20 is a plan view of a circuit substrate illustrating another warpage preventing pattern inserted between two corner warpage preventing patterns according to an embodiment of the invention.

FIG. 20 is a plan view of a circuit substrate illustrating another warpage preventing pattern inserted between two corner warpage preventing patterns according to an embodiment of the invention.

Referring to FIG. 20, an additional (auxiliary) warpage preventing pattern A2 may be inserted between two corner warpage preventing patterns in order to reduce cross-over stress between the corners. The additional warpage preventing pattern A2 may include one or more auxiliary warpage preventing members CL5 which may be at an angle with respect to the warpage preventing members L0, L1 of the corner warpage preventing patterns P1, P2. This arrangement may be particularly useful to block stress propagating along the edge of the circuit substrate 100, i.e. perpendicular to the additional warpage preventing pattern A2. The additional warpage preventing pattern C2 can have any shape discussed above with respect to the warpage preventing pattern P, e.g., an arc, a straight line, angled, a meandering line and so on. The warpage preventing members CL5 of the additional warpage preventing pattern C2 may also be displaced in various directions along the edge of the circuit substrate 100 so as to block stresses propagating in various directions.

Figure 21:
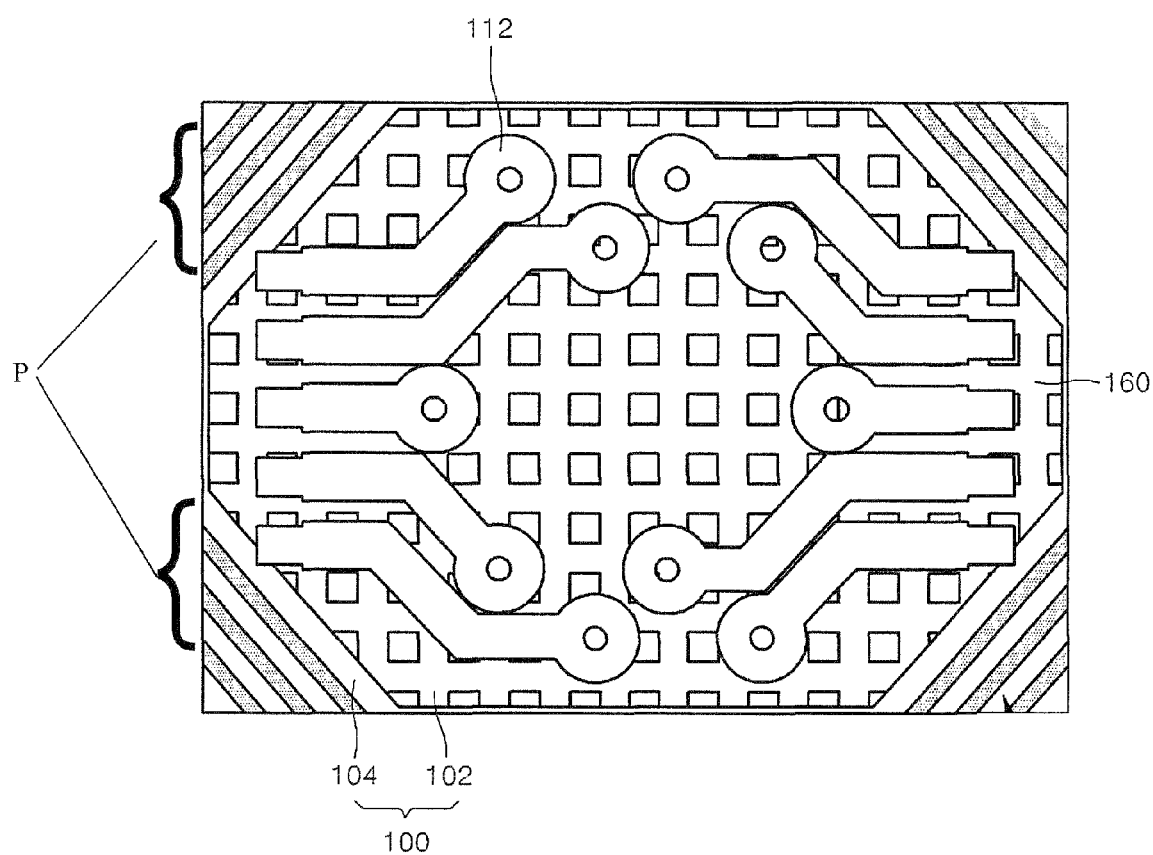
FIG. 21 is a plan view of a circuit substrate illustrating a dummy region according to some embodiments of the invention.

FIG. 21 is a plan view of a circuit substrate illustrating a dummy region according to some embodiments of the invention.

Referring to FIG. 21, a dummy pattern 160 may be disposed in the conductive pattern region 102. The dummy pattern 160 may coordinate with the warpage preventing pattern P to reduce or minimize stress concentration at the corners of the circuit substrate 100. The dummy pattern 160 may be any of, for example, a mesh, plane, or island type pattern. In the conventional art described above, the dummy pattern was formed without the warpage preventing pattern, thereby exacerbating the warpage problem discussed above. However, if the dummy pattern 160 is formed together with the warpage preventing pattern P of the invention, the dummy pattern 160 can help reduce the warpage problem.

Figure 22A:
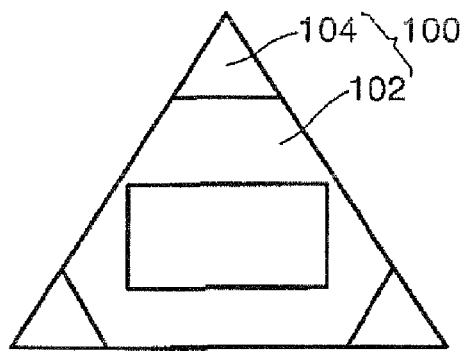
FIGS. 22a-22c are illustrations of various types of circuit substrates according to some embodiments of the invention.
Figure 22B:
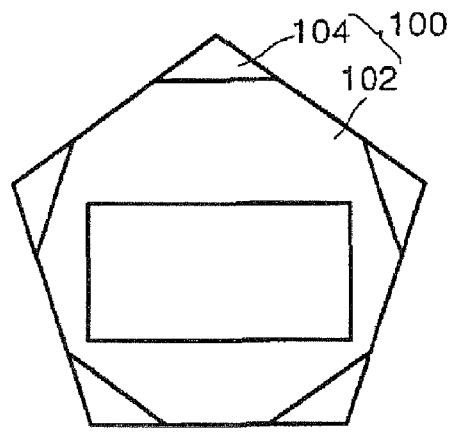
Figure 22C:
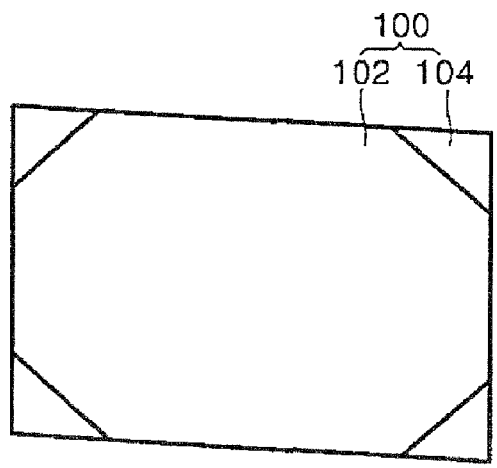

FIGS. 22a-22c are illustrations of various types of circuit substrates.

Referring to FIGS. 22a through 22c, the circuit substrate 100 may be formed of various types of polygons having at least three corners or vertices, e.g., a triangular type, FIG. 22a, a pentagonal type, FIG. 22b, or a polygonal type, FIG. 22c. In other words, the use of a warpage preventing pattern P is independent of the shape of the circuit substrate. The warpage preventing pattern P may be formed at all corners of the various shaped circuit substrates, or it may only be formed at some of the corners. Further, the warpage preventing pattern P of the triangular and pentagonal type circuit substrates may include features of the various embodiments described above with respect to the rectangular circuit substrate 100.

Figure 23:
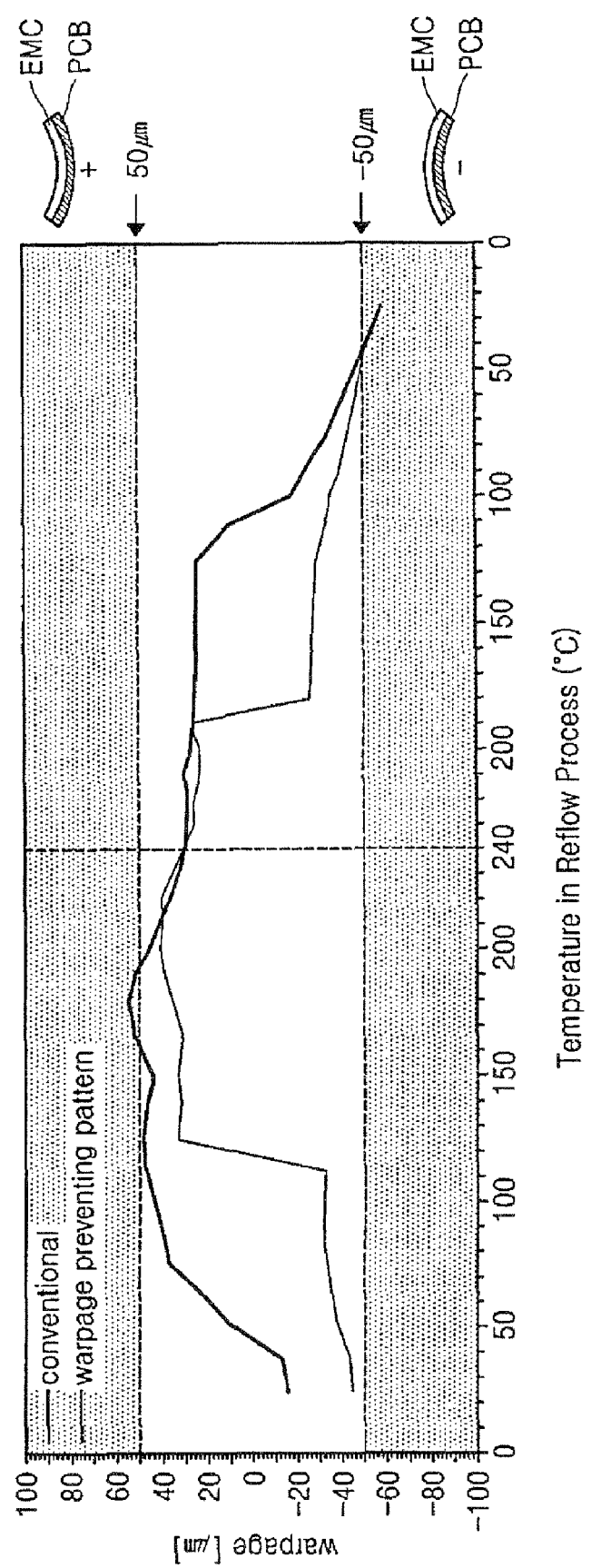
FIG. 23 is a graph showing the warpage of a chip package during a heating process.

FIG. 23 is a graph showing the warpage of a chip package during a heating process such as a solder reflow process.

Referring to FIG. 23, the inclusion of a warpage preventing pattern P in a chip package reduces the stress concentration at the corner of a circuit substrate, along with the resulting warpage, experienced by the chip package during a heating process. As shown in FIG. 23, at the high temperature range during the reflow process, the conventional chip package has a warpage of more than 50 µm, resulting in warping of the corners of the package. However, at the high temperature range, the warpage of the chip package including the warpage preventing members according to some embodiments of the invention was contained under 50 µm. Thus, the warping of the chip package at the corner portion has been substantially decreased. By reducing the warpage of the chip package, the reliability of the chip package can be improved and the incidence of open connections can be reduced.

Referring again to FIGS. 4 and 19, a semiconductor chip package may include a rectangular circuit substrate 100, the rectangular circuit substrate 100 having two long edges and two short edges. The semiconductor chip package may also include a conductive pattern region 102 and a warpage preventing pattern P disposed on the circuit substrate 100. The warpage preventing pattern P may include a first pattern, a second pattern, a third pattern, and a fourth pattern each disposed at first, second, third, and fourth corners of the circuit substrate 100, respectively. The overall orientation of the first pattern may be different from the overall orientation of the second pattern and the first corner and second corner may be adjacent to each other. The first corner and the third corner may be opposite to each other and the first pattern and the third pattern may be oriented along substantially the same direction. The first pattern, the second pattern, the third pattern, and the fourth pattern may each comprise a plurality of warpage preventing members. As shown in FIG. 19, the first pattern may be connected to the second pattern by a first subsidiary pattern, the second pattern may be connected to the third pattern by a second subsidiary pattern, the third pattern may be connected to the fourth pattern by a third subsidiary pattern, and the fourth pattern may be connected to the first pattern by a fourth subsidiary pattern.

Herein below, a brief description about methods of forming circuit substrates is provided without specific processing steps. Here, well-known processes are omitted in order not to obscure the description of the invention with unnecessary detail.

According to one embodiment, a method of fabricating a circuit substrate such as one shown in FIG. 4 having a warpage preventing pattern P may include preparing an electrically insulating substrate 100, forming a conductive pattern 112 in a conductive pattern region 102 of the substrate 100, forming a first warpage preventing pattern at a first corner of the substrate 100, and forming a second warpage preventing pattern at a second corner of the substrate 100. The first and second corners are adjacent to each other. The first warpage preventing pattern and the second warpage preventing pattern may be oriented so as to oppose stress fields directed from a an interior region of the substrate to the first and second regions of the substrate 100. An overall orientation of the first warpage preventing pattern may be different from an overall orientation of the second warpage preventing pattern with respect to the substrate.

Figure 24:
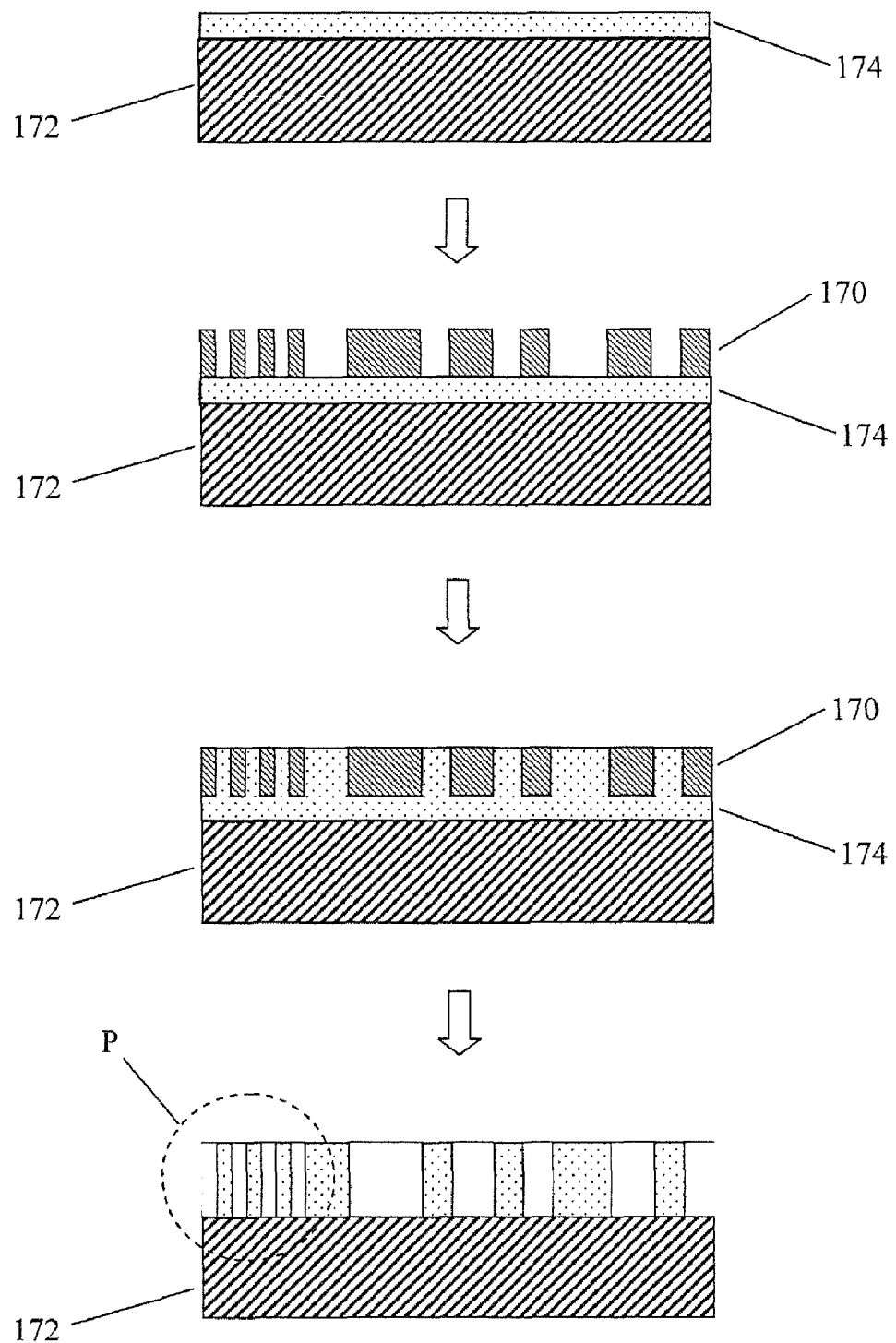
FIG. 24 illustrates a method of forming a warpage preventing pattern using an additive process.
Figure 25:
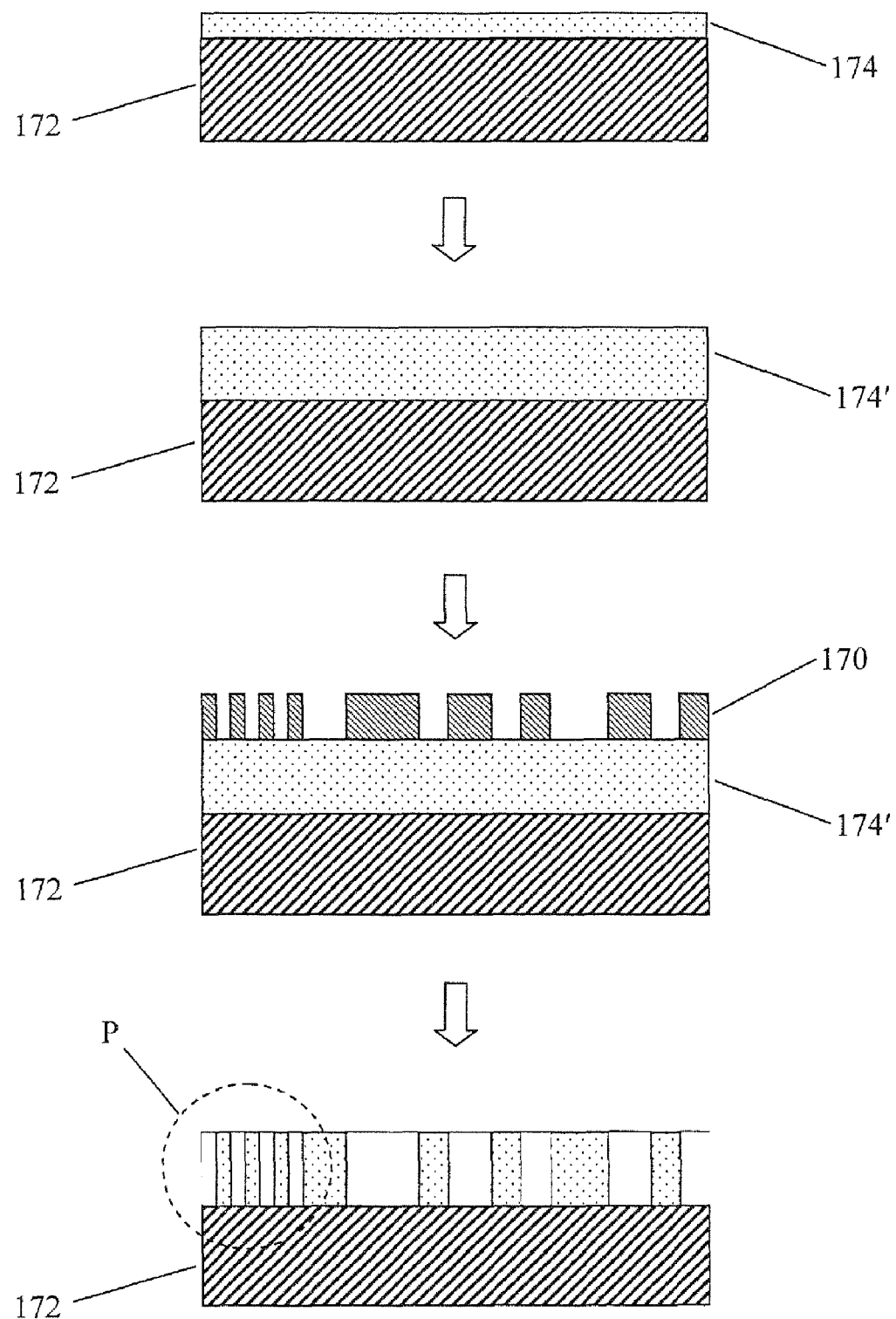
FIG. 25 illustrates a method of forming a warpage preventing pattern using an etching process.

FIG. 24 illustrates a method of forming a warpage preventing pattern using an additive process. FIG. 25 illustrates a method of forming a warpage preventing pattern using an etching process.

Forming the warpage preventing pattern P from a conductive material such as copper can be accomplished by either an additive type process or an etching type process. As shown in FIG. 24, in the additive process, a dry film pattern 170 such as a photoresist pattern is first formed on a core substrate 172 having, e.g., a conductive material foil layer such as a copper foil layer 174. The core substrate 172 may comprise a dielectric material, e.g., laminate composed of a polymer (epoxy, polyimide, TEFLON or polyester, for example) reinforced with woven glass mat, or a polymer reinforced with chopped glass fibers. The Young's modulus for the core substrate 172 may be in a range of about 23100 to about 23300 MPa. Also, the Young's modulus for the conductive material may be greater than that of the core substrate, e.g., 120000 MPa as in the case of copper. Copper plating, for example, is then used to build up a copper pattern on the copper foil layer 174. The areas of the copper foil layer 174 covered by the dry film 170 will not have copper plated on them. Finally, the dry film pattern 170 and the portions of the copper foil layer 174 covered by the dry film pattern 170 are removed, leaving behind the desired warpage preventing pattern P.

In the etching type process, as shown in FIG. 25, a suitable conductive material such as copper is first plated onto a core substrate 172 having a conductive material foil layer such as a copper foil layer 174

Then, a dry film pattern 170 such as a photoresist pattern is formed on the plated copper layer 174'. Next, the plated copper layer 174' is etched to remove the portions of the layer 174' that are exposed by the dry film pattern 170. Finally, the dry film pattern 170 is stripped from the plated copper layer 174', leaving behind the desired warpage preventing pattern P FIGS. 26a through 26c illustrate the formation of solder resist (not illustrated in FIG. 4) on a core substrate 172 in accordance with some embodiments of the invention.

Figure 26A:
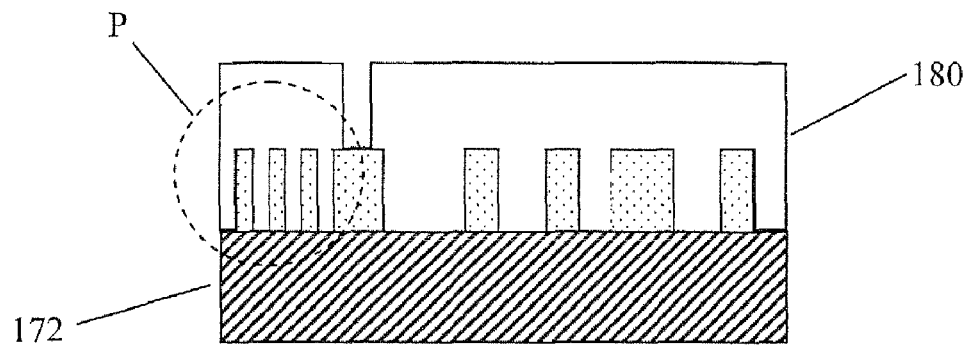
FIGS. 26a through 26c illustrate the formation of solder resist on a core substrate in accordance with some embodiments of the invention.
Figure 26B:
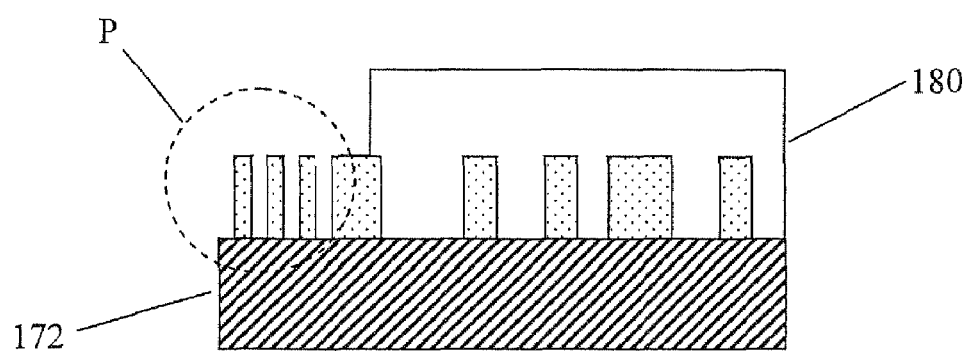
Figure 26C:
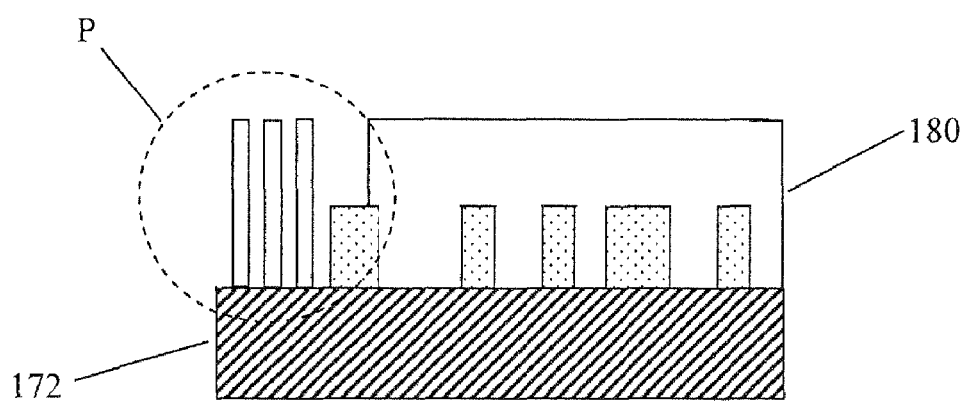

Once the warpage preventing pattern P is formed on the core substrate 172, a solder resist layer 180 may be formed to cover at least a portion of the warpage preventing pattern P and the core substrate 172, as shown in FIG. 26a. The solder resist layer 180 may not be formed over the warpage preventing pattern P, as shown in FIG. 26b. In other words, the solder resist 180 exposes at least a portion of the warpage preventing pattern P.

It should be understood that the above processes for forming the warpage preventing pattern P may be performed substantially simultaneously with processes for forming the conductive pattern on the substrate 100. Further, the warpage preventing pattern P may be formed from a material other than copper. As an example, the warpage preventing pattern P may be formed by forming a solder resist layer 180 and patterning thereof, as shown in FIG. 26c.

Also, when the substrate 100 comprises more than one layer, the above processes for forming the warpage preventing pattern P may be repeated on more than one layer. For instance, a portion of the warpage preventing pattern P may be formed at a first corner of the substrate 100 on a first layer and another portion of the warpage preventing pattern P may be formed at a second corner of the substrate 100 on a second layer. The layers may then be combined into the substrate 100, which may have the warpage preventing pattern P on more than one surface or at more than one corner.

According to other embodiments of the invention, although not specifically illustrated, a method of fabricating a circuit substrate having a warpage preventing pattern P, such as the one shown in FIG. 4, may include preparing a rectangular electrically insulating substrate 100, forming a conductive pattern in a conductive pattern region 102 of the substrate 100, forming a warpage preventing region 104 on the substrate 100 such that the conductive pattern region 102 and the warpage preventing region 104 do not overlap, and forming first, second, third, and fourth warpage preventing patterns on first, second, third, and fourth corner regions of the warpage preventing region 104, respectively. The warpage preventing region 104 may comprise the four corners of the substrate 100. The first warpage preventing pattern and the second warpage preventing pattern may be oriented differently so as to oppose stress fields directed from an interior region of the substrate 100 to the first and second corner regions of the substrate 100, respectively.

According to another embodiment, forming a first warpage preventing pattern may include forming a plurality of warpage preventing members on the first corner region and forming a second warpage preventing pattern may include forming a plurality of warpage preventing members on the second corner region. In this case, the warpage preventing members on the first corner region may be at an angle with respect to the warpage preventing members on the second corner region.

The warpage preventing members may be formed of the same material as the conductive pattern. Alternatively, the warpage preventing members may be formed of the different material as the conductive pattern. In this case, the warpage preventing members may be formed of a solder resist material.

Although all of the methods to form the circuit substrates discussed above have not provided herein, one skilled in the art will appreciate the methods of forming such circuit substrates of the present application using the methods described with respect to FIG. 4 and FIGS. 24 through FIG. 26c and other known assembly techniques.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

The foregoing is merely illustrative of the invention in its broader aspects and is not to be construed as limiting thereof. Although a few exemplary embodiments of this invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A circuit substrate comprising:
   a substrate having a first edge adjacent to a second edge and the first edge also adjacent to a third edge, the first edge and second edge meeting at a first corner, thereby forming a first corner region and the first edge and third edge meeting at a second corner, thereby forming a second corner region; and
   a warpage preventing pattern disposed on the substrate, the warpage preventing pattern comprising a first pattern including a first plurality of members at the first corner region of the substrate and a second pattern including a second plurality of members at the second corner region of the substrate,
   wherein each member of the first plurality of members is part of the first pattern disposed on the substrate and extends diagonally from the first edge to the second edge,
   wherein each member of the second plurality of members is part of the second pattern disposed on the substrate and extends diagonally from the first edge to the third edge, and
   wherein the first pattern is disconnected from the second pattern.

2. The circuit substrate of claim 1, wherein a longitudinal axis of at least a portion of the first pattern is oriented at an angle with respect to a longitudinal axis of at least a portion of the second pattern.

3. The circuit substrate of claim 1, wherein the members of the first pattern and the second pattern are oriented to intersect stress lines directed from an interior region of the substrate to the first and second corners of the substrate.

4. The circuit substrate of claim 1, wherein each member of the first and second plurality of members includes a substantially straight line, a meandering line, an angled line, a rounded line, a partially rounded line, or combinations thereof.

5. The circuit substrate of claim 1, further comprising a conductive pattern region disposed in an interior region of the substrate, wherein at least one member of the first an second plurality of members contacts the conductive pattern region.

6. The circuit substrate of claim 1, further comprising a plurality of solder ball pads disposed on the substrate, wherein at least one of the solder ball pads penetrates the first pattern such that at least one member of the first pattern is divided into a plurality of sub-members.

7. The circuit substrate of claim 1, wherein the members of at least one of the first or second plurality of members are angle-shaped, with the point of the members directed toward a center area of the circuit substrate.

8. The circuit substrate of claim 1, wherein the members of at least one of the first or second plurality of members are angle-shaped, with the point of the members directed away from the center area of the circuit substrate.

9. The circuit substrate of claim 1, wherein an axis extending from the center area of the substrate to the first corner intersects at least one member of the first or second plurality of members at an approximately 90 degree angle.

10. The circuit substrate of claim 1, wherein the members of the first plurality of members of the first pattern increase incrementally in length from the first corner.

11. The circuit substrate of claim 1, wherein at least one of the members of at least one of the first and second patterns is substantially parallel with another member of the at least one of the first and second patterns.

12. The circuit substrate of claim 1, further comprising an auxiliary pattern disposed between the first pattern and the second pattern, the auxiliary pattern comprising one or more auxiliary warpage preventing members.

13. The circuit substrate of claim 1, further comprising a dummy pattern disposed in an interior region of the substrate adjacent the first and second patterns.

14. The circuit substrate of claim 1, wherein the substrate is a polygon having at least three corners.

15. The circuit substrate of claim 1, wherein the members of the first pattern or second pattern extends along a direction orthogonal to an axis bisecting a corresponding corner.

16. The circuit substrate of claim 1, wherein at least one of the first or second plurality of members comprise a conductive material.

17. The circuit substrate of claim 1, wherein at least one of the first or second plurality of members comprises a non-conductive material.

18. The circuit substrate of claim 5, wherein the conductive pattern region comprises a conductive pattern and the conductive pattern penetrates the at least one member such that the at least one member is divided into a plurality of sub-members.

19. The circuit substrate of claim 12, wherein the one or more auxiliary warpage preventing members are disposed at an angle with respect to the members of the first pattern or the second pattern.

20. The circuit substrate of claim 13, wherein the dummy pattern is one of a mesh type pattern, a plane type pattern, and an island type pattern.

21. The circuit substrate of claim 14, wherein the polygon is one of a rectangular type, a triangular type and a pentagonal type.

22. A circuit substrate comprising:
   a substrate including a conductive pattern region and a warpage preventing region, the substrate having a first edge adjacent to a second edge and the first edge also adjacent to a third edge, the first edge and second edge meeting at a first corner, thereby by forming a first corner region and the first edge and third edge meeting at a second corner, thereby forming a second corner region; and a warpage preventing pattern disposed on the warpage preventing region, the warpage preventing pattern comprising a first pattern including a first group of members the first corner region of the substrate and a second pattern including a second group of members at the second corner region of the substrate, wherein each member of the first group of members part of the first pattern disposed on the substrate and extends diagonally between the first edge and the second edge, wherein each member of the second group of members is part of the second pattern disposed on the substrate and extends diagonally between the first edge and the third edge, wherein the first pattern and second patterns are disconnected from each other.

23. The circuit substrate of claim 22, wherein the substrate is a rectangular substrate, the rectangular substrate having two long edges and two short edges, the circuit substrate further comprising:

a conductive pattern disposed on the conductive pattern region, wherein the warpage preventing pattern further comprises:

a third pattern at a third corner of the rectangular substrate, wherein the first corner and the third corner are opposite to each other and the first pattern and the third pattern are oriented along substantially the same direction.

24. The circuit substrate of claim 22, wherein one of the members of either of the first pattern or the second pattern disposed closer to a corresponding one corner of the substrate are smaller than another member disposed farther from the corresponding one corner of the substrate.

25. The circuit substrate of claim 22, wherein the warpage preventing pattern comprises a conductive material.

26. The circuit substrate of claim 22, wherein the warpage preventing pattern comprises a non-conductive material.

27. The circuit substrate of claim 22, wherein the warpage preventing pattern comprises a solder resist material.

28. The semiconductor package of claim 22, wherein at least one end of at least one member of the first or second group of members extends to an edge of the substrate.

29. A semiconductor package comprising:

a substrate having a first edge adjacent to a second edge and the first edge also adjacent to a third edge, the first edge and second edge meeting at a first corner, thereby forming a first corner region and the first edge and third edge meeting at a second corner, thereby forming a second corner region;

a conductive pattern region defined in an interior region of the substrate;

a warpage preventing region defined in the first and second corner regions of the substrate outside of the conductive pattern region;

a conductive pattern disposed on the conductive pattern region;

a plurality of bond fingers disposed on the conductive pattern region;

a plurality of solder ball pads disposed on the conductive pattern region;

a semiconductor chip disposed on the substrate, the semiconductor chip having a plurality of bond pads disposed thereon, at least one bond pad electrically connected to at least one bond finger; and a warpage preventing pattern disposed on the warpage preventing region, the warpage preventing pattern comprising:

a first pattern including a first plurality of members at the first corner region of the substrate; and a second pattern including a second plurality of members at a second corner region of the substrate, wherein each member of the first plurality of members is part of the first pattern disposed on the substrate and extends diagonally between the first edge and the second edge, wherein each member of the second plurality of members is part of the second pattern disposed on the substrate and extends diagonally between the first edge and the third edge, and wherein the first pattern is disconnected from the second pattern.

30. The semiconductor package of claim 29, wherein at least one of the first or second plurality of members comprise a conductive material.

31. The semiconductor package of claim 29, wherein at least one of the first or second plurality of members comprise a non-conductive material.

32. The semiconductor package of claim 29, wherein each member of the first and second plurality of members includes a substantially straight line, a meandering line, an angled line, a rounded line, a partially rounded line, or combinations thereof.

33. The semiconductor package of claim 29, wherein the members of the first plurality of members of the first pattern increase incrementally in length from the first corner.

34. The semiconductor package of claim 29, wherein at least one end of at least one member of the first or second plurality of members extends to an edge of the substrate.

35. The semiconductor package of claim 32, wherein at least one of the members of at least one of the first and second patterns is parallel with another member of the at least one of the first and second patterns.

* * * * *